(12) United States Patent
Sugiyama et al.

(10) Patent No.: US 10,564,524 B2
(45) Date of Patent: Feb. 18, 2020

(54) ELECTRONIC APPARATUS

(71) Applicant: SONY CORPORATION, Tokyo (JP)

(72) Inventors: Taiki Sugiyama, Kanagawa (JP); Yuichi Ishida, Kanagawa (JP); Takashi Oishi, Tokyo (JP); Kazuhiko Suzuki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/768,581

(22) PCT Filed: Sep. 20, 2016

(86) PCT No.: PCT/JP2016/004281
§ 371 (c)(1),
(2) Date: Apr. 16, 2018

(87) PCT Pub. No.: WO2017/073010
PCT Pub. Date: May 4, 2017

(65) Prior Publication Data
US 2018/0307122 A1    Oct. 25, 2018

(30) Foreign Application Priority Data

Oct. 27, 2015 (JP) ................................ 2015-210929
Aug. 9, 2016 (JP) ................................ 2016-156256

(51) Int. Cl.
*G03B 17/55* (2006.01)
*G03B 17/02* (2006.01)
(Continued)

(52) U.S. Cl.
CPC ............. *G03B 17/55* (2013.01); *G03B 17/02* (2013.01); *G06F 1/1635* (2013.01);
(Continued)

(58) Field of Classification Search
USPC .......................................................... 396/539
See application file for complete search history.

(56) References Cited

U.S. PATENT DOCUMENTS 7,550,097 B2 * 6/2009 Tonapi ..................... C09K 5/14
106/1.18
8,587,945 B1 * 11/2013 Hartmann .......... H05K 7/20454
361/679.53

(Continued)

FOREIGN PATENT DOCUMENTS

CN   105264039 A   1/2016
CN   105393651 A   3/2016
(Continued)

OTHER PUBLICATIONS

International Search Report and Written Opinion of PCT Application No. PCT/JP2016/004281, dated Dec. 20, 2016, 13 pages.

*Primary Examiner* — Clayton E. LaBalle
*Assistant Examiner* — Warren K Fenwick
(74) *Attorney, Agent, or Firm* — Chip Law Group

(57) ABSTRACT

There is provided an electronic apparatus that comprises a housing, an imaging element disposed in the housing, a battery disposed in the housing, and a heat storage material filled in a space in the housing and thermally connected to at least one of the imaging element or the battery.

21 Claims, 14 Drawing Sheets

(51) Int. Cl.
    G06F 1/16      (2006.01)
    G06F 1/20      (2006.01)
    H05K 7/20      (2006.01)
    F28D 20/02     (2006.01)
(52) U.S. Cl.
    CPC .......... G06F 1/1686 (2013.01); G06F 1/203 (2013.01); H05K 7/2029 (2013.01); *F28D 20/02* (2013.01); *G03B 2217/002* (2013.01); *G03B 2217/007* (2013.01); *G06F 1/1616* (2013.01); *G06F 1/1626* (2013.01)

(56) References Cited

U.S. PATENT DOCUMENTS

| | | | |
|---|---|---|---|
| 2015/0350392 A1* | 12/2015 | Park | H04M 1/0202 455/575.6 |
| 2016/0130492 A1 | 5/2016 | Matsumura et al. | |
| 2016/0156213 A1 | 6/2016 | Yajima et al. | |
| 2018/0212290 A1* | 7/2018 | Saiga | H01M 10/6556 |

FOREIGN PATENT DOCUMENTS

| | | |
|---|---|---|
| EP | 3020779 A1 | 5/2016 |
| JP | 05-102355 A | 4/1993 |
| JP | 2000-209474 A | 7/2000 |
| JP | 2010-129788 A | 6/2010 |
| JP | 2012-060073 A | 3/2012 |
| JP | 2015-029036 A | 2/2015 |
| KR | 10-2016-0096539 A | 8/2016 |
| WO | 2015/087620 A1 | 6/2015 |

* cited by examiner

ELECTRONIC APPARATUS

CROSS REFERENCE TO RELATED APPLICATIONS

This application is a U.S. National Phase of International Patent Application NO. PCT/JP2016/004281 filed on Sep. 20, 2016, which claims priority benefit of Japanese Patent Application No. JP 2015-210929 filed in the Japan Patent Office on Oct. 27, 2015 and also claims priority benefit of Japanese Patent Application No. JP 2016-156256 filed in the Japan Patent Office on Aug. 9, 2016. Each of the above-referenced applications is hereby incorporated herein by reference in its entirely.

TECHNICAL FIELD

The present technology relates to an electronic apparatus.

BACKGROUND ART

Conventionally, in order to efficiently dissipate heat generated from an electronic component, a technique of filling a space in a power supply unit or a semiconductor device with a resin has been disclosed (Patent Document 1). By filling the space with a resin having a thermal conductivity higher than that of air, it is possible to efficiently dissipate heat generated from an electronic component.

CITATION LIST

Patent Document

Patent Document 1: Japanese Patent Application Laid-Open No. 2010-129788

SUMMARY OF THE INVENTION

Problems to be Solved by the Invention

However, due to a recent increase in power consumption of an electronic apparatus, it has become impossible to sufficiently suppress a rise in temperature of an inside of an electronic apparatus or an electronic component disadvantageously even by using these heat dissipation techniques utilizing a resin having a high thermal conductivity.

The present technology has been achieved in view of such a problem, and an object thereof is to provide an electronic apparatus capable of efficiently suppressing a rise in temperature of an inside or a surface of a housing.

Solutions to Problems

In order to solve the above-described problem, the present technology provides an electronic apparatus including: a housing; an imaging element disposed in the housing; a battery disposed in the housing; and a heat storage material filled in a space in the housing and thermally connected to the imaging element and/or the battery.

Effects of the Invention

The present technology can efficiently suppress a rise in temperature of an inside of an electronic apparatus or a surface of a housing. Note that the effects described here are not necessarily limited, and may include any of the effects described in the specification.

MODE FOR CARRYING OUT THE INVENTION

Hereinafter, embodiments of the present technology will be described with reference to the drawings. Note that the description will be made in the following order.
<1. First Embodiment>
[1-1. Configuration of electronic apparatus]
[1-2. Configuration of heat storage material]
[1-3. Effect by heat storage material]
<2. Second Embodiment>
[2-1. Configuration of electronic apparatus]
[2-2. Configuration of heat storage material]
<3. Third Embodiment>
[3-1. Configuration of electronic apparatus]
[3-2. Configuration of heat storage material]
<4. Application example to other apparatuses>
[4-1. First example]
[4-2. Second example]
[4-3. Third Example]
[4-4. Fourth Example]
[4-5. Fifth example]
<5. Modification Example>
<1. First Embodiment>
[1-1. Configuration of Electronic Apparatus]

Figure 1:
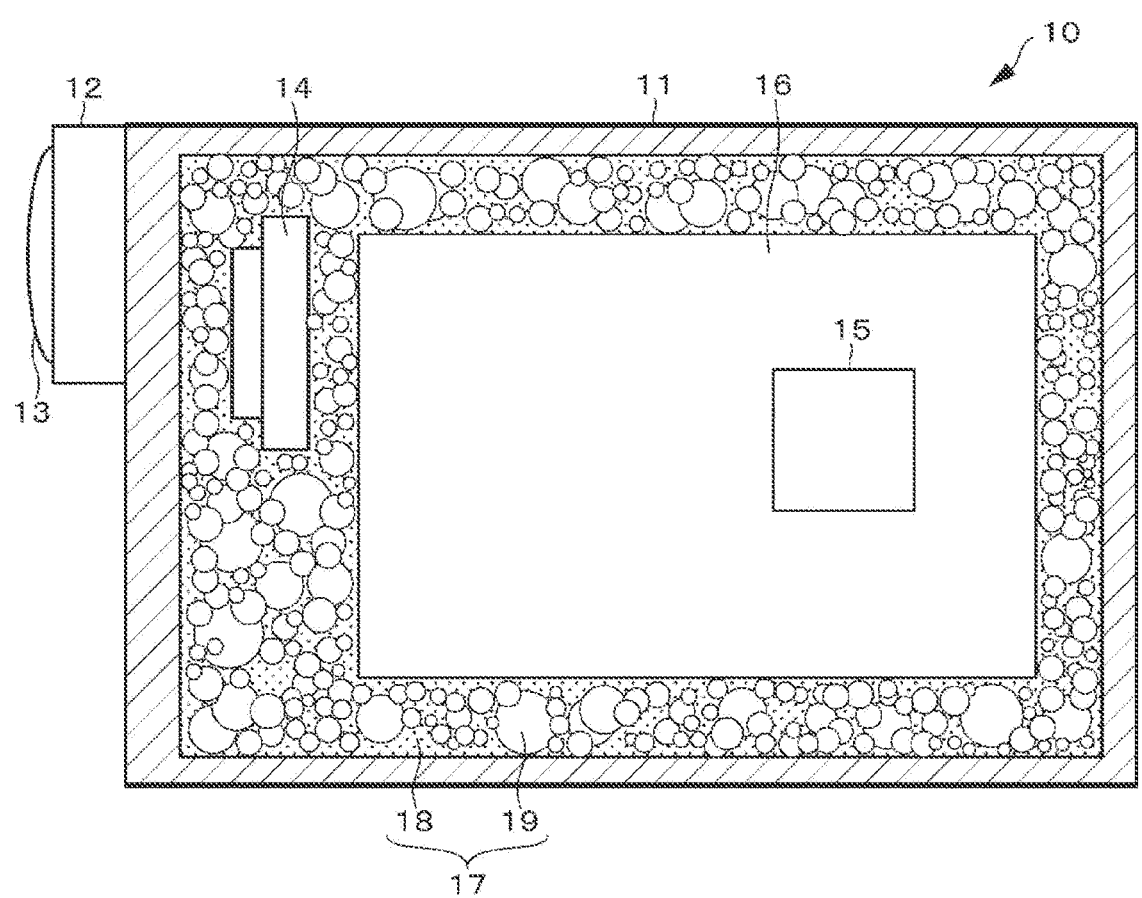
FIG. 1 is a diagram illustrating a configuration of an electronic apparatus according to a first embodiment.

First, a configuration example of an imaging device which is an electronic apparatus 10 according to a first embodiment will be described. FIG. 1 is a diagram illustrating the configuration of the electronic apparatus 10.

The electronic apparatus 10 includes a housing 11, an optical imaging system 12, an imaging element 14, a control circuit 15, a battery 16, and a heat storage material 17.

The housing 11 includes a synthetic resin such as plastic, metal, or the like, and constitutes an exterior of the electronic apparatus 10. The optical imaging system 12, the imaging element 14, the control circuit 15, the battery 16, and the heat storage material 17 are disposed in the housing 11.

The optical imaging system 12 includes a photographing lens 13 for focusing light from a subject on the imaging element 14, a driving mechanism for focusing and zooming by moving the photographing lens 13, an iris mechanism, a shutter mechanism, and the like. These are driven by control of the control circuit 15. An optical image of a subject obtained through the optical imaging system 12 is formed on the imaging element 14. The driving mechanism, the iris mechanism, the shutter mechanism, and the like of the optical imaging system 12 are operated according to control of the control circuit 15 by a lens driving driver (not illustrated) including, for example, a microcomputer and the like.

The imaging element 14 photoelectrically converts incident light from a subject into a charge amount, and outputs the charge amount as an analog imaging signal. The analog imaging signal output from the imaging element 14 is output to the control circuit 15. As the imaging element 14, a charge coupled device (CCD), a complementary metal oxide semiconductor (CMOS), or the like is used.

The control circuit 15 includes a central processing unit (CPU), a random access memory (RAM), a read only memory (ROM), and the like. A ROM stores a program read and operated by a CPU and the like. A RAM is used as a work memory of a CPU. A CPU executes various kinds of processing according to a program stored in a ROM and issues a command to control the whole and each unit of the electronic apparatus 10. The control circuit 15 is mounted on the electronic apparatus 10, for example, in a form of a semiconductor integrated circuit, a semiconductor chip or the like.

The control circuit 15 performs sample hold and the like on an imaging signal output from the imaging element 14 so as to maintain a good signal/noise (S/N) ratio by correlated double sampling (CDS) processing. Furthermore, the control circuit 15 controls a gain by auto gain control (AGC) processing, performs analog/digital (A/D) conversion, and outputs a digital image signal.

In addition, the control circuit 15 performs predetermined signal processing such as demosaic processing, white balance adjustment processing, color correction processing, gamma correction processing, Y/C conversion processing, auto exposure (AE) processing, or resolution conversion processing on an image signal. Furthermore, the control circuit 15 performs coding processing, for example, for recording or communication, on image data which has been subjected to the predetermined processing.

The battery 16 is an electric power source for supplying electric power to each unit constituting the electronic apparatus 10. As the battery 16, for example, a lithium ion battery is used.

A space in the housing 11 is filled with the heat storage material 17. The heat storage material 17 is thermally connected to (physically in contact with) an electronic component such as the imaging element 14, the control circuit 15, or the battery 16, serving as a heat source in the electronic apparatus 10, and the whole or some parts of an inner surface of the housing 11, and suppresses a rise in temperature of an inside of the electronic apparatus 10 or a surface of the housing 11 by storing heat generated from the heat source in a form of latent heat. Details of the configuration of the heat storage material 17 will be described later.

Although not illustrated, the electronic apparatus 10 may further include a storage medium, a display unit, an input unit, a communication terminal, and the like. The storage medium is a large-capacity storage medium such as a hard disc drive (HDD), a solid state drive (SSD), or an SD memory card, for example. An image photographed by the electronic apparatus 10 is stored while being compressed on the basis of a standard such as joint photographic experts group (JPEG), for example. In addition, exchangeable image file format (EXIF) data including information regarding a stored image and additional information such as imaging date and time is also stored in association with the image. In addition, a moving image is stored in a format such as moving picture experts group 2 (MPEG 2) or MPEG 4, for example.

The display unit is a display device including, for example, a liquid crystal display (LCD), a plasma display panel (PDP), an organic electro luminescence (EL) panel and the like. On the display unit, a user interface of the electronic apparatus 10, a menu screen, a monitoring image during imaging, a photographed image recorded on a storage medium, a photographed moving image, and the like are displayed.

The input unit includes, for example, a power supply button for turning power supply on/off, a release button for instructing start of recording a photographed image, an operator for zoom adjustment, a touch screen integrated with the display unit and the like. If an input is made to the input unit, a control signal corresponding to the input is generated and output to the control circuit 15. Then, the control circuit 15 performs calculation processing or control corresponding to the control signal.

The communication terminal connects the electronic apparatus 10 to an external apparatus using a cable. By the connection, data can be transmitted between the electronic apparatus 10 and the external apparatus. Examples of the external apparatus include a personal computer, a printer, a smartphone, a tablet terminal, a storage device such as a hard disk drive or a universal serial bus (USB) memory, a display device such as a television or a projector and the like. Examples of a communication standard include USB, local area network (LAN), high-definition multimedia interface (HDMI) (registered trademark) and the like. Note that communication with the external device may be performed not only by wired connection but also by wireless connection using wireless fidelity (Wi-Fi), wireless LAN, ZigBee, Bluetooth (registered trademark), or the like.

The electronic apparatus 10 is configured as described above.

[1-2. Configuration of Heat Storage Material]

Next, details of the heat storage material 17 filled in a space in the electronic apparatus 10 will be described. The heat storage material 17 includes a first heat storage material 18 and a second heat storage material 19. The first heat storage material 18 is a liquid adjusted so as to have an appropriate viscosity or a gel-like thermally conductive resin. The first heat storage material 18 stores heat by sensible heat. Note that the thermally conductive resin included in the first heat storage material 18 may be a rubber-like resin or a solid harder than rubber.

The first heat storage material 18 is a liquid before being injected into the housing 11, and may react with moisture or the like in air after injection, may be hardened (solidified) by heating or anaerobic conditions, or may be cured (solidified) in the housing 11 by mixing two liquids, reacting with moisture or the like in air after mixing the two liquids, or by heating or anaerobic conditions. However, the first heat storage material 18 may be a material which can be used while being in a liquid state.

A final form of the thermally conductive resin after filling may be a liquid, a gel, a rubber, or a hard solid. It is only required to be able to fill and hold a liquid having an appropriate viscosity such that the liquid can be injected into the housing 11, serving as a raw material, in the housing 11. The thermally conductive resin is characterized by having higher thermal conduction than air (thermal conductivity 0.02 W/m·K), and refers to both a base resin alone and a composite resin obtained by mixing a heat dissipation filler with the base resin. Examples of the base resin include silicone, urethane, epoxy, an acrylic resin, olefin, phenol, polyimide and the like. However, silicone gel, silicone rubber, urethane gel, urethane rubber, an epoxy resin, and the like are frequently used as a filler. There is no large difference in thermal conductivity (about 0.02 W/m·K) among these base materials. In order to improve a thermally conductive property, a heat dissipation filler is mixed therewith. Examples of an insulating heat dissipation filler include aluminum oxide, aluminum hydroxide, magnesium oxide, magnesium hydroxide, silicon oxide, zinc oxide, boron nitride, aluminum nitride, silicon nitride, silicon carbide, and diamond. Examples of a conductive heat dissipation filler include a carbon fiber, graphite, a carbon nanotube, graphene, aluminum, copper and the like. In a case where a conductive material is used as a filler, it is necessary to subject the material to insulation coating, or to subject a side of a member such as a circuit board in contact with the filler to insulation coating. In addition, these heat dissipation fillers may be used singly or in combination of a plurality of kinds thereof. In addition, these heat dissipation fillers may be subjected to an appropriate surface treatment in order to enhance interfacial adhesion with a resin. For example, in a case where silicone is used as the base resin and aluminum oxide is used as the heat dissipation filler, silicone and aluminum oxide are mixed with each other after the filler is subjected to a surface treatment with a silane coupling agent. Incidentally, in a case where a circuit component, an electronic component, and the like included in the electronic apparatus 10, such as the imaging element 14, the control circuit 15, or the battery 16, have been subjected to insulation coating, a material used as the above heat dissipation filler can be used without being subjected to insulation coating.

The second heat storage material 19 includes a latent heat storage material, and is in a form of many fine capsules (particles) coated with a polymer, inorganic glass, or the like. The second heat storage material 19 stores heat by latent heat. As illustrated in FIG. 1, the second heat storage material 19 is mixed in the first heat storage material 18.

The second heat storage material 19 is, for example, in a form of a capsule having a size of several micrometers to several millimeters in diameter. By setting the sizes of the capsules to various sizes without unifying the sizes, it is possible to fill a space in the electronic apparatus 10 with the capsules at a high filling ratio. In addition, by constituting the heat storage material 17 not only with the capsule-shaped second heat storage material 19 but also with the liquid or gel-like first heat storage material 18 in combination, it is possible to fill a space in the electronic apparatus 10 therewith without a gap. Note that a phase change temperature of the second heat storage material 19 serving as a latent heat storage material is about 0 to 100 degrees. However, the phase change temperature is not limited thereto.

Examples of an organic latent heat storage material include a paraffin (n-nonadecane, n-icosane, n-heneicosane, n-docosane, n-tricosane, n-tetracosane, n-pentacosane, n-hexacosane, n-heptacosane, n-octacosane, n-nonacosane, n-triacontane, n-hentriacontane, n-dotriacontane, n-tritriacontane, paraffin wax and the like), a fatty acid or a fatty acid ester (capric acid, undecylic acid, lauric acid, tridecylic acid, myristic acid, pentadecylic acid, palmitic acid, margaric acid, stearic acid, nonadecylic acid, arachidic acid, heneicosylic acid, behenic acid, lignoceric acid, triacontanoic acid, hydroxystearic acid, sebacic acid, crotonic acid, elaidic acid, eruca acid, nervonic acid, and a fatty acid ester (including esters of the above-described fatty acids)), a sugar alcohol (xylitol, erythritol, mannitol, sorbitol, galactitol, threitol and the like) and the like. In addition to these materials, polyethylene, tetradecanol, dodecanol, polyglycol, naphthalene, propionamide, acetamide, biphenyl, dimethylsulfoxide, a trimethylolethane hydrate, a side chain crystalline polymer, an organometallic complex, and the like may be used. In addition, a mixture or a eutectic of two or more of these organic materials may be used, or a mixture including one or more of these materials as a main component and further including another secondary component (benzoic acid, urea, water, or the like) may be used.

Examples of an inorganic hydrated salt-based latent heat storage material include a sodium acetate hydrate, a potassium acetate hydrate, a sodium hydroxide hydrate, a potassium hydroxide hydrate, a strontium hydroxide hydrate, a barium hydroxide hydrate, a sodium chloride hydrate, a magnesium chloride hydrate, a potassium chloride hydrate, a calcium chloride hydrate, a zinc chloride hydrate, a lithium nitrate hydrate, a magnesium nitrate hydrate, a calcium nitrate hydrate, an aluminum nitrate hydrate, cadmium nitrate, an iron nitrate hydrate, a zinc nitrate hydrate, a manganese nitrate hydrate, a lithium sulfate hydrate, a sodium sulfate hydrate, a magnesium sulfate hydrate, a calcium sulfate hydrate, a potassium aluminum sulfate hydrate, an aluminum ammonium sulfate hydrate, a sodium thiosulfate hydrate, a potassium phosphate hydrate, a sodium phosphate hydrate, a potassium hydrogen phosphate hydrate, a sodium hydrogen phosphate hydrate, a sodium borate hydrate, a calcium bromide hydrate, a potassium fluoride hydrate, a sodium carbonate hydrate and the like. In addition, a mixture or a eutectic of two or more of these inorganic hydrated salt-based materials may be used, or a mixture including one or more of these materials as a main component and further including another secondary component (urea, an ammonium salt, water, or the like) may be used.

Examples of a solid phase transition heat storage material include an electron phase transition heat storage material (for example, a material including $VO_2$, vanadium oxide doped with any one of W, Re, Mo, Ru, Nb, Ta, and the like in $VO_2$, or any one of $LiMn_2O_4$, $LiVS_2$, $LiVO_2$, $NaNiO_2$, $REBaFe_2O_5$, and $REBaCo_2O_{5.5}$ "here, RE represents a rare earth element such as Y, Sm, Pr, Eu, Gd, Dy, Ho, or Tb" can be used. In addition, for example, a mixture of two or more of these materials may be used, or a mixture including one or more of these materials as a main component and further including another secondary component may be used), a thermochromic material (such as N,N-diethylethylenediamine copper complex), a soft-viscous crystal (trimethylol ethane, pentaerythritol, neopentyl glycol, or the like), other interstitial structural phase transition materials and the like.

Hitherto, examples of the latent heat storage material have been mentioned, but the latent heat storage material is not limited thereto, and another latent heat storage material may be used.

Note that it is necessary to use an insulating material as the heat storage material 17. For example, this is because a short circuit occurs if a non-insulating heat storage material having electrical conductivity or ionic conductivity comes into contact with a metal portion of the control circuit 15 or the like. However, a non-insulating heat storage material can also be used as the heat storage material 17 as long as not being in contact with a metal portion of the control circuit 15 or the like. Therefore, in a case where the control circuit 15 or the like is coated with a thin insulating material or covered with an insulating case or the like, the heat storage material 17 can be constituted by using a non-insulating heat storage material without being subjected to insulation coating.

In addition, by coating the second heat storage material 19 with a thin insulating material to be formed in a capsule shape and mixing the capsule-shaped second heat storage material 19 with the first heat storage material 18, it is possible to prevent the second heat storage material 19 from coming into direct contact with a metal portion of the control circuit 15 or the like. Therefore, by adopting this method, a heat storage material having electrical conductivity or ionic conductivity can also be used as the second heat storage material 19.

Note that the heat storage material 17 may be cured (solidified) after being filled in the housing 11, and may be removable after curing (solidification) (may have reworkability).

Figure 2:
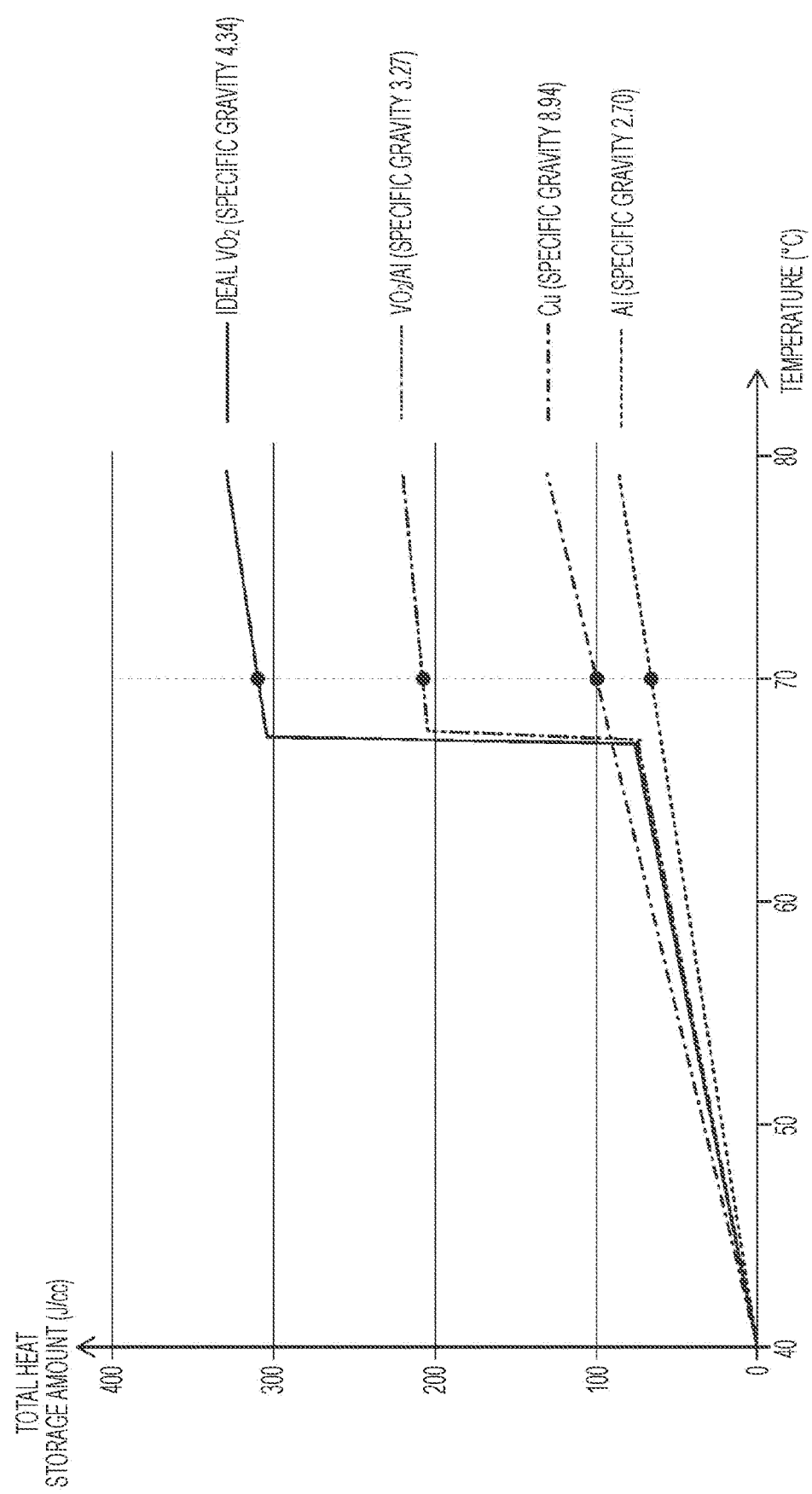
FIG. 2 is a graph illustrating a result obtained by comparing the heat storage amount among heat storage materials.

The graph in FIG. 2 illustrates a result obtained by comparing the total heat storage amount per 1 cc among materials. The graph of FIG. 2 illustrates a result obtained by comparing the total heat storage amount among four materials of aluminum (Al), copper (Cu), vanadium dioxide ($VO_2$)/aluminum (Al) (57 vol %/43 vol %), and ideal vanadium dioxide $VO_2$ (100%). Note that vales of specific gravity of the materials are aluminum Al (specific gravity 2.70), copper Cu (specific gravity 8.94), vanadium dioxide $VO_2$/aluminum Al (specific gravity 3.27), and ideal vanadium dioxide $VO_2$ (specific gravity 4.34). The total heat storage amount is the total heat storage amount of the heat storage amount due to sensible heat and the heat storage amount due to latent heat. Note that an ambient temperature is 40° C. In addition, a transition temperature of $VO_2$ is 68° C.

Note that the heat storage amount due to sensible heat in the total heat storage amount can be determined by the following numerical formula (1), and the heat storage amount due to latent heat in the total heat storage amount can be determined by the following numerical formula (2).

[Numerical Formula 1]

Heat storage amount due to sensible heat (J/cc)=specific heat×specific gravity×temperature change amount (1)

[Numerical Formula 2]

Heat storage amount due to latent heat (J/cc)=latent heat amount (2)

The transition temperature of $VO_2$ is 68° C. Therefore, as seen from FIG. 2, a phase change occurs at 68° C. in $VO_2$/Al and ideal $VO_2$, and the total heat storage amount is largely increased. As a result, the total heat storage amount of $VO_2$/Al up to 70° C. is about 3 times that of Al and about 2 times that of Cu, and the weight of $VO_2$/Al up to 70° C. is about 1.2 times that of Al and about 0.4 times that of Cu.

In addition, the total heat storage amount of ideal $VO_2$ up to 70° C. is about 4.3 times that of Al and about 3.2 times that of Cu. Therefore, by using $VO_2$, it is possible to store more heat than Al and Cu. In addition, the graph of FIG. 2 indicates that heat storage due to sensible heat largely contributes to an increase in the heat storage amount in addition to heat storage due to latent heat.

Figure 3:
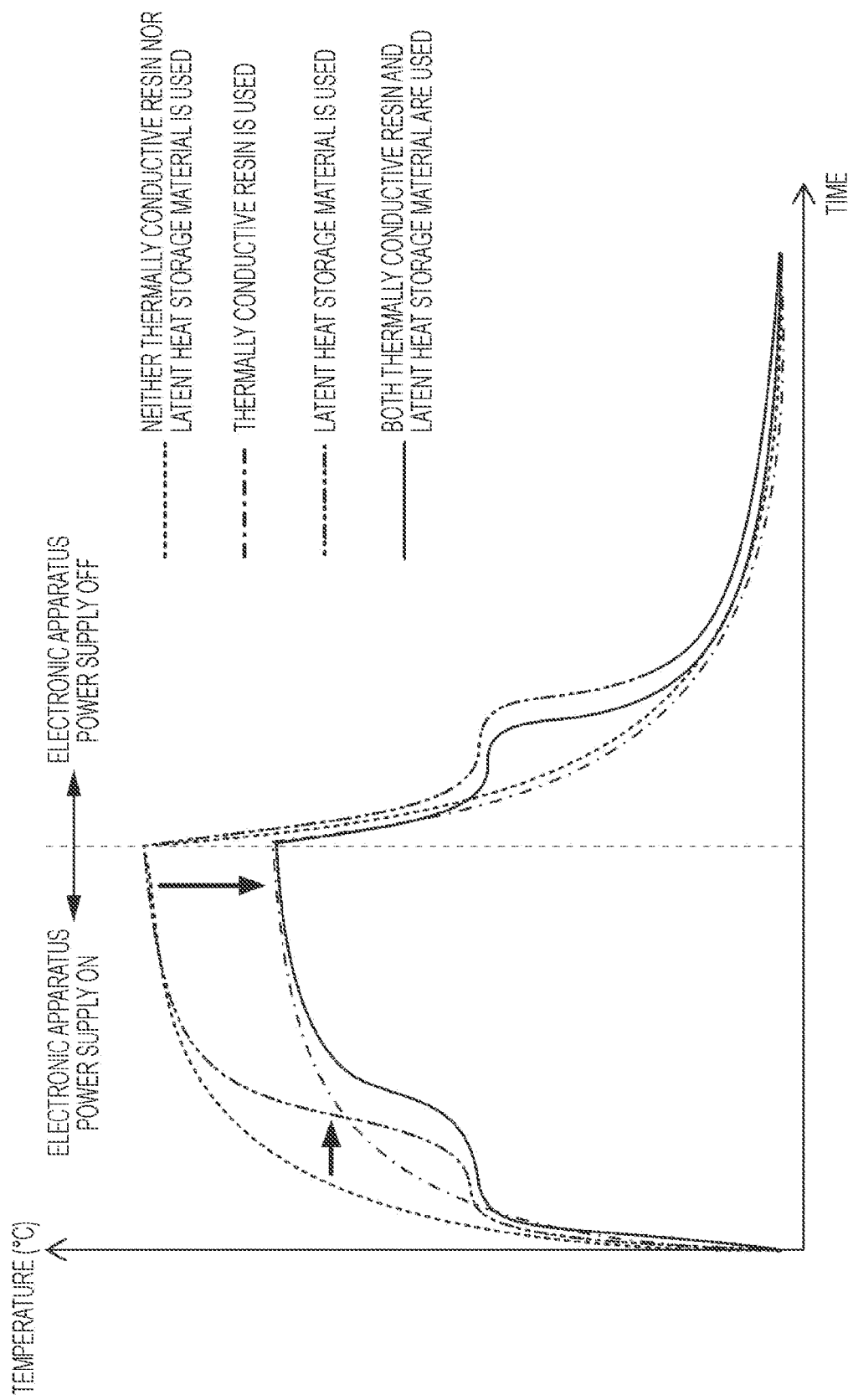
FIG. 3 is a graph illustrating an overview of a change in temperature of an imaging element in a case where a latent heat storage material and a thermally conductive resin for heat dissipation are used.

FIG. 3 is a graph illustrating an overview of a change in temperature of an imaging element in a case where a latent heat storage material and a thermally conductive resin for heat dissipation are used. The one-dot chain line in the graph of FIG. 3 indicates a change in temperature in a case where only a thermally conductive resin obtained by mixing a heat dissipation filler with a base resin is used as a thermally conductive resin for heat dissipation. The two-dot chain line indicates a change in temperature in a case where only a latent heat storage material as a heat storage material is used. The solid line indicates a change in temperature in a case where the first heat storage material 18 (thermally conductive resin obtained by mixing a heat dissipation filler with a base resin) and the second heat storage material 19 (latent heat storage material) are used in combination in the present embodiment. The broken line indicates a change in temperature in a case where neither a thermally conductive resin nor a latent heat storage material is used.

The thermally conductive resin obtained by mixing a heat dissipation filler with a base resin, serving as the first heat storage material 18, is a material for promoting heat dissipation by being filled in voids in the apparatus. In addition, the latent heat storage material serving as the second heat storage material 19 is a material for absorbing heat with high density utilizing phase change/phase transition of a substance.

In a case of using only a thermally conductive resin for heat dissipation indicated by the one-dot chain line, a saturation temperature can be lowered by an effect of the thermally conductive resin as compared with a state using nothing indicated by the broken line. In addition, in a case of using only a latent heat storage material indicated by the two-dot chain line, a rise in temperature can be delayed by an effect of the latent heat storage material as compared with a state using nothing indicated by the broken line.

Therefore, as indicated by the solid line, in the present embodiment, by using the first heat storage material 18 (thermally conductive resin obtained by mixing a heat dissipation filler with a base resin) and the second heat storage material 19 (latent heat storage material) in combination, it is possible to further delay a rise in temperature while a saturation temperature is lowered as compared with a state using nothing indicated by the broken line.

Specific materials that can be used are listed in Table 1 below. Note that air, a silicone resin, a urethane resin, silicone/aluminum oxide ($Al_2O_3$), and urethane/boron nitride (BN) denoted by the numbers 1 to 5 in Table 1 are listed as Comparative Examples. The materials denoted by the numbers 6 to 13 are examples of specific materials that may be used in the present embodiment.

TABLE 1

| Name of material | Thermal conductivity W/mK | Latent heat storage density J/cc | Heat storage temperature ° C. | Specific heat J/gK | Density g/cm³ |
|---|---|---|---|---|---|
| 1 Air (nothing is filled) | 0.0256 | — | — | 1.0 | 0.0012 |
| 2 Silicone resin | 0.2 | — | — | 2 | 1.0 |
| 3 Urethane resin | 0.2 | — | — | 2 | 1.0 |
| 4 Silicone/Al₂O₃ (60 vol %/40 vol %) | 1.0 (Actually measured value) | — | — | 1.5 | 2.2 |
| 5 Urethane/BN (80 vol %/20 vol %) | 0.6 (Actually measured value) | — | — | 1.7 | 1.3 |
| 6 Microcapsules obtained by coating silicone/paraffin with melamine resin (60 vol %/40 vol %) | 0.2 | 30 | 57 | 2 | 0.98 |
| 7 Urethane/heat storage microcapsules (60 vol %/40 vol %) | 0.2 | 30 | 57 | 2 | 0.98 |
| 8 Silicone/VO₂ (60 vol %/40 vol %) | 1.5 | 95 | 67 | 1.5 | 2.3 |
| 9 Urethane/VO₂ (60 vol %/40 vol %) | 1.5 | 95 | 67 | 1.5 | 2.3 |
| 10 Microcapsules obtained by coating silicone/BN/paraffin with melamine resin (45 vol %/10 vol %/45 vol %) | 1.0 | 80 | 57 | 1.9 | 1.1 |
| 11 Urethane/BN/heat storage microcapsules (45 vol %/10 vol %/45 vol %) | 1.0 | 80 | 57 | 1.9 | 1.1 |
| 12 Silicone/BN/VO₂ (60 vol %/10 vol %/30 vol %) | 2.1 | 71 | 67 | 1.5 | 2.1 |
| 13 Urethane/BN/VO₂ (60%/10%/30%) | 2.1 | 71 | 67 | 1.5 | 2.1 |

Figure 4:
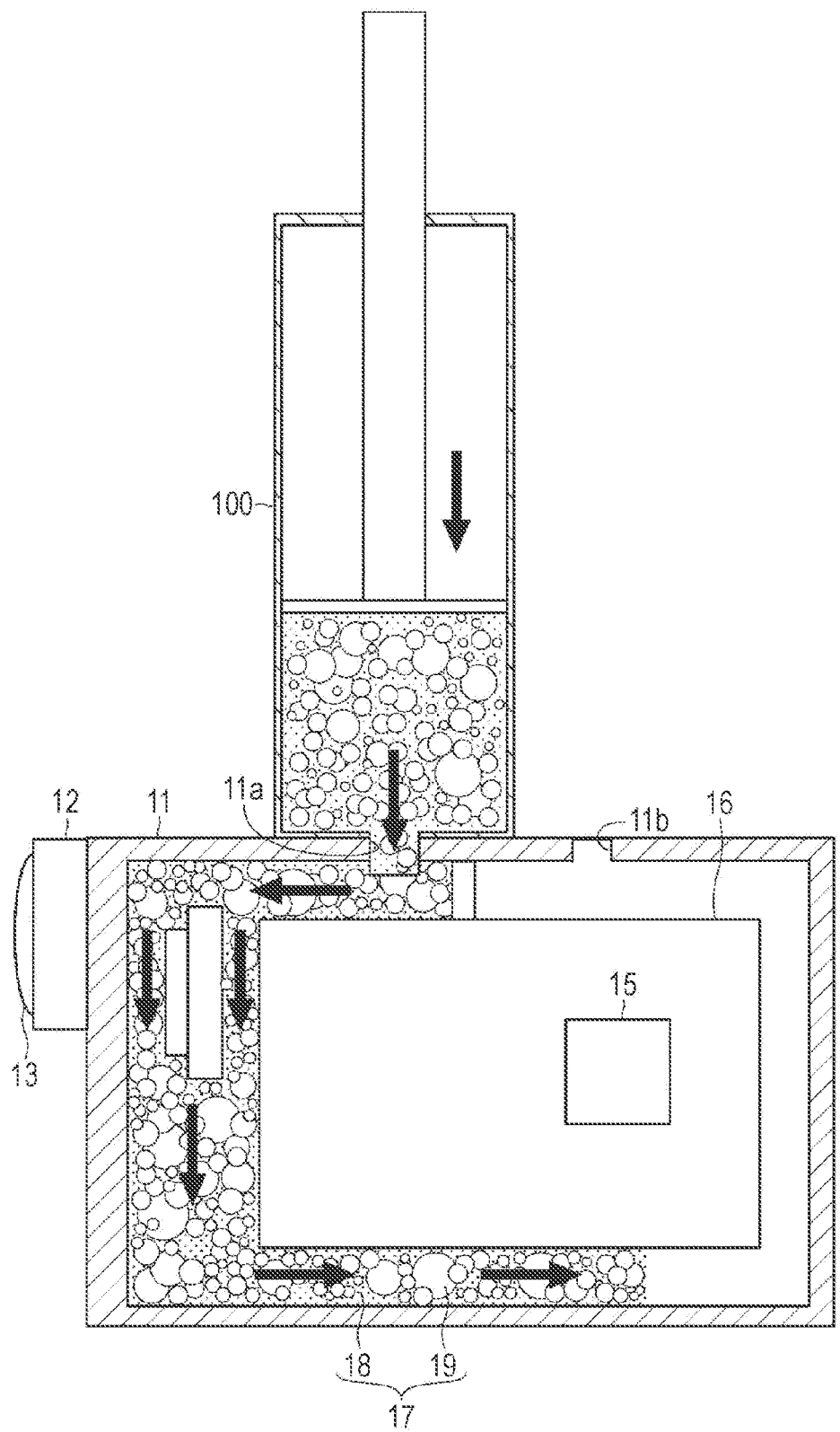
FIG. 4 is a diagram illustrating a method for injecting a heat storage material into a housing.

Next, a method for filling the heat storage material 17 in the electronic apparatus 10 will be described with reference to FIG. 4. The housing 11 of the electronic apparatus 10 is configured to have a high degree of hermeticity, and includes an injection port 11a and an air hole 11b. The air hole 11b preferably has a check valve structure.

For example, an addition reaction type liquid silicone is used as a base resin, aluminum oxide (alumina) is used as a heat dissipation filler, and particles (heat storage capsules) obtained by coating a paraffin with a polymer are used as a latent heat storage material. The base resin, the heat dissipation filler, and the latent heat storage material are weighed, put in a container, and mixed together thoroughly using a rotation/revolution mixer to adjust the liquid heat storage material 17.

A tip of an injector 100 such as a syringe filled with the heat storage material 17 is connected to the injection port 11a, a piston of the injector 100 is pushed out, and the heat storage material 17 in the injector 100 is thereby gradually filled in the housing 11. At this time, by sucking air in the housing 11 from the air hole 11b with a vacuum pump or the like, the heat storage material 17 can be efficiently injected into the housing 11. Then, after a predetermined amount of the heat storage material 17 is all filled in the housing 11, the injection port 11a and the air hole 11b are closed.

Then, the electronic apparatus 10 filled with the heat storage material 17 is placed in a high temperature environment (for example, 50 to 60° C., 100° C. or lower), and the heat storage material 17 is cured (solidified). By placing the electronic apparatus 10 in a high temperature environment, the heat storage material 17 can be cured (solidified) in a shorter time.

Incidentally, without using the injector 100, by setting a container previously filled with the heat storage material 17 in the injection port 11a and sucking air in the housing 11 from the air hole 11b with a vacuum pump, the heat storage material 17 may be sucked from the container, and the heat storage material 17 may be filled in the housing 11.

It is good to cover, in advance, a portion with which the heat storage material 17 should not come into contact, such as a terminal portion of the battery 16, a terminal portion of a storage medium, or a communication terminal, with a cap, a case, or the like including an insulating material. In addition, it is necessary to prevent the heat storage material 17 from entering a lens barrel (light path) included in the optical imaging system 12. Therefore, the lens barrel also needs to be covered with a cap or the like. This is because the heat storage material 17 which has entered the lens barrel blocks light and makes photographing impossible.

In addition, the battery 16 may be in direct contact with the heat storage material 17. However, if a battery case to house the battery 16 in the housing 11 is filled with the heat storage material 17, the battery 16 cannot be housed. Therefore, in a case where a battery case is disposed in the housing 11, it is good to dispose an object having the same shape as the battery 16 in the battery case such that the battery case is not filled with the heat storage material 17. After the heat storage material 17 is filled, if the object is removed, the battery 16 can be housed in the battery case. Note that an effect of preventing a rise in temperature is higher in a case where the heat storage material 17 is in direct contact with the battery 16.

An inside of the housing 11 preferably has a structure in which the heat storage material 17 is easily filled, for example, a structure having a few branches of a flow path of the heat storage material 17 or a few fine flow paths.

In addition, a backflow prevention wall for preventing a backflow of the heat storage material 17 may be disposed in the housing 11.

[1-3. Effect by Heat Storage Material]

Figure 5:
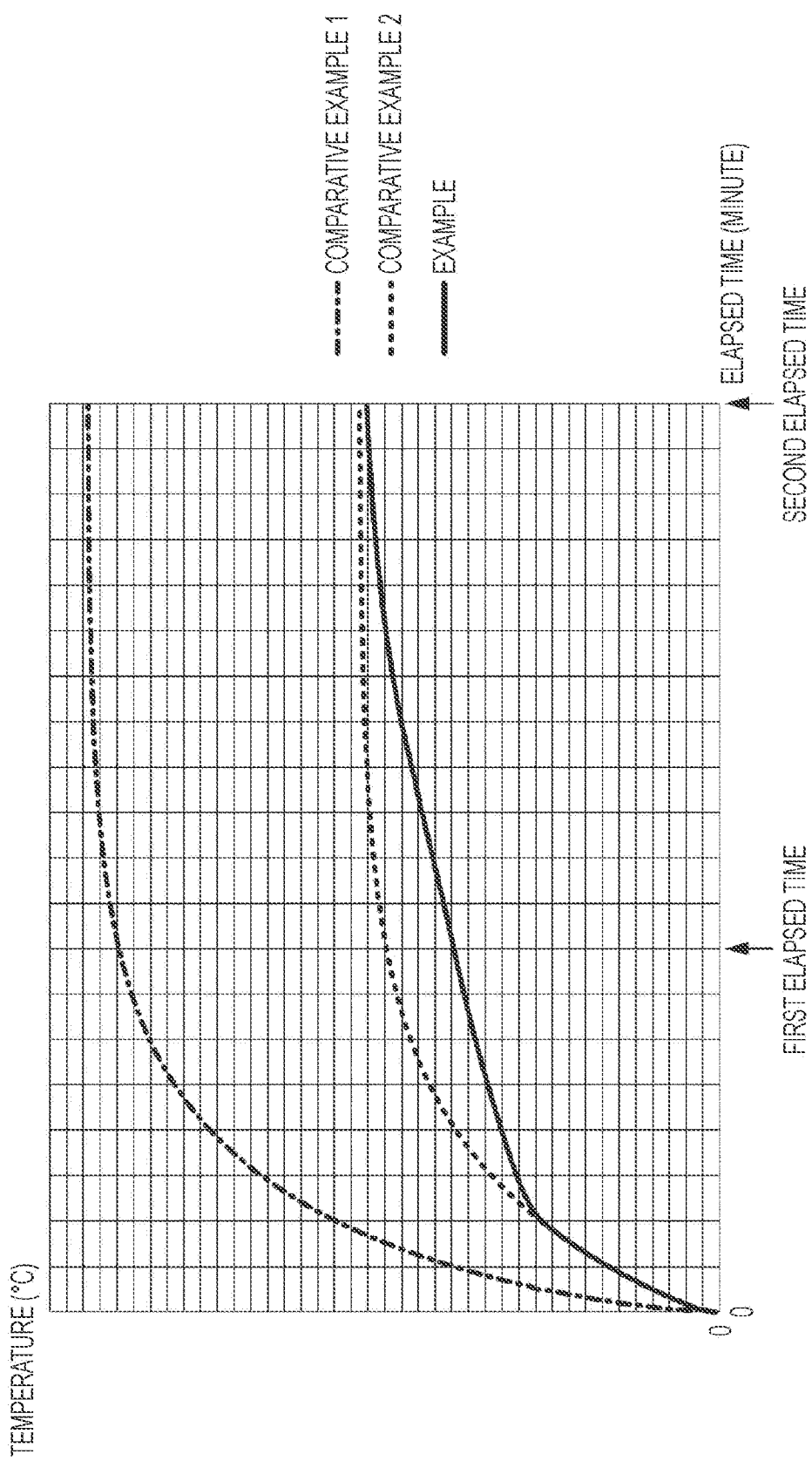
FIG. 5 is a graph illustrating a change in temperature of an imaging element included in an electronic apparatus.

Next, an effect of preventing a rise in temperature of the electronic apparatus 10 by the above-described heat storage material 17 will be described. FIG. 5 is a graph illustrating a change in temperature of the imaging element 14 included in the electronic apparatus 10.

In Comparative Examples and Example described below, in three cases of a case where nothing was filled in a space in the housing 11 of the electronic apparatus 10 (only air was filled), a case where only a thermally conductive resin was filled, and a case where the heat storage material 17 including the first heat storage material 18 (thermally conductive resin) and the second heat storage material 19 (latent heat storage material) was filled, a thermal fluid simulation was performed under a 40 degree environment, and a change in temperature of the imaging element 14 was measured.

(Comparative Example 1)

While nothing was filled in a space in the housing 11 of the electronic apparatus 10 (only air was filled), a thermal conductivity was set to 0.0256 W/m·K, a specific heat was set to 1.006 J/gK, and a density was set to 0.001205 g/cm$^3$.

(Comparative Example 2)

While a thermally conductive resin was filled in a space in the housing 11 of the electronic apparatus 10, a thermal conductivity was set to 1.1 W/m·K, a specific heat was set to 1.000 J/gK, and a density was set to 1.700 g/cm$^3$.

(Example)

While the heat storage material 17 including the first heat storage material 18 which was a thermally conductive resin and the second heat storage material 19 which was a latent heat storage material was filled in a space in the housing 11 of the electronic apparatus 10, a thermal conductivity was set to 1.0 W/m·K, a heat storage density was set to 90.9 J/g, a heat storage temperature was set to 57 to 51 degrees, a specific heat was set to 2.000 J/gK, and a density was set to 0.880 g/cm$^3$.

(Evaluation)

In Example indicated by the solid line in the graph of FIG. 5, a rise in temperature of the imaging element 14 is suppressed as compared with Comparative Example 1 indicated by the one-dot chain line. In Example, a reduction in temperature of about 55% is realized at the first elapsed time on the basis of Comparative Example 1. In addition, a reduction in temperature of about 45% is realized at the second elapsed time as compared with Comparative Example 1.

In addition, in Example, a rise in temperature of the imaging element 14 is suppressed as compared with Comparative Example 2 indicated by the broken line in the graph of FIG. 5. In Example, a reduction in temperature of about 20% is realized at the first elapsed time on the basis of Comparative Example 2.

Figure 6:
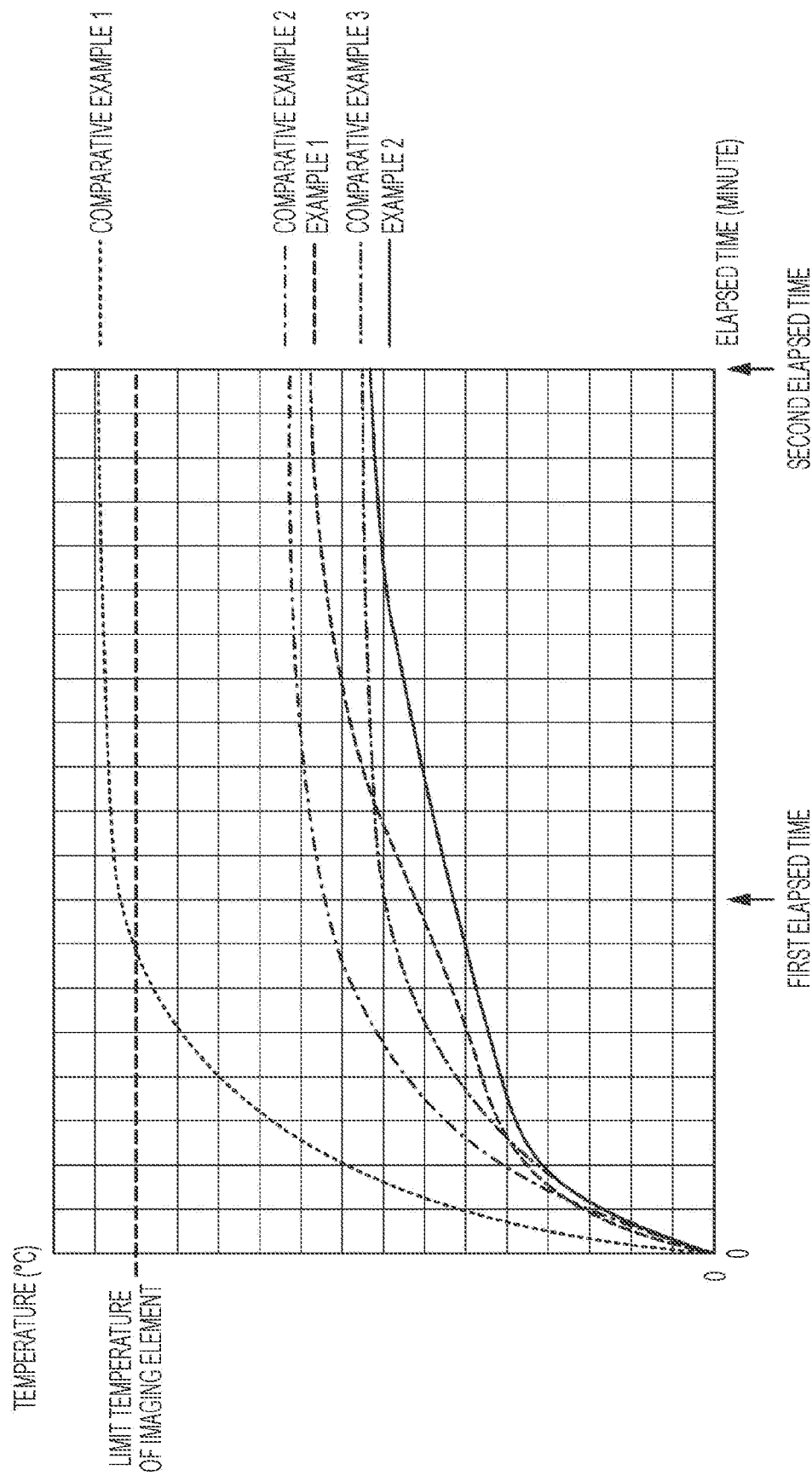
FIG. 6 is a graph illustrating a change in temperature of an imaging element included in an electronic apparatus.

FIG. 6 is a graph illustrating a change in temperature of the imaging element 14 included in the electronic apparatus 10 in a case where a material used as the heat storage material 17 is more specific.

In Comparative Examples and Examples described below, in five cases of a case where nothing was filled in a space in the housing 11 of the electronic apparatus 10 (only air was filled), a case where a silicone resin was filled as a thermally conductive resin only, a case where silicone/boron nitride (BN) was filled as a thermally conductive resin only, a case where microcapsules obtained by coating silicone/paraffin with a melamine resin were filled as the heat storage material 17 including the first heat storage material 18 (thermally conductive resin) and the second heat storage material 19 (latent heat storage material), and a case where microcapsules obtained by coating silicone/boron nitride (BN)/paraffin with a melamine resin were filled as the heat storage material 17 including the first heat storage material 18 (thermally conductive resin) and the second heat storage material 19 (latent heat storage material), a thermal fluid simulation was performed under a 40 degree environment, and a change in temperature of the imaging element 14 was measured.

(Comparative Example 1)

While nothing was filled in a space in the housing 11 of the electronic apparatus 10 (only air was filled), a thermal conductivity was set to 0.0256 W/m·K, a specific heat was set to 1.0 J/gK, and a density was set to 0.0012 g/cm$^3$.

(Comparative Example 2)

While a silicone resin was filled in a space in the housing 11 of the electronic apparatus 10, a thermal conductivity was set to 0.2 W/m·K, a specific heat was set to 2.0 J/gK, and a density was set to 1.0 g/cm$^3$.

(Comparative Example 3)

While a silicone resin/boron nitride (BN) was filled in a space in the housing 11 of the electronic apparatus 10, a thermal conductivity was set to 0.6 W/m·K, a specific heat was set to 1.7 J/gK, and a density was set to 1.3 g/cm$^3$.

(Example 1)

Microcapsules obtained by coating silicone/paraffin with a melamine resin were filled in a space in the housing 11 of the electronic apparatus 10 as the heat storage material 17 including the first heat storage material 18 which was a thermally conductive resin and the second heat storage material 19 which was a latent heat storage material. A thermal conductivity was set to 0.2 W/m·K, a latent heat storage density was set to 30 J/cc, a heat storage temperature was set to 57° C., a specific heat was set to 2.0 J/gK, and a density was set to 0.98 g/cm$^3$.

(Example 2)

While microcapsules obtained by coating silicone/boron nitride (BN)/paraffin with a melamine resin were filled in a space in the housing 11 of the electronic apparatus 10 as the heat storage material 17 including the first heat storage material 18 which was a thermally conductive resin and the second heat storage material 19 which was a latent heat storage material, a thermal conductivity was set to 1.0 W/m·K, a latent heat storage density was set to 80 J/cc, a heat storage temperature was set to 57° C., a specific heat was set to 1.9 J/gK, and a density was set to 1.1 g/cm$^3$.

(Evaluation)

In Examples 1 and 2 indicated by the solid lines in the graph of FIG. 6, a rise in temperature of the imaging element 14 is suppressed as compared with Comparative Examples 1 to 3. In Example 1, a reduction in temperature of about 50% is realized at the first elapsed time as compared with Comparative Example 1. In addition, in Example 1, a reduction in temperature of about 35% is realized at the second elapsed time as compared with Comparative Example 1.

In Example 1, a reduction in temperature of about 25% is realized at the first elapsed time as compared with Comparative Example 2. In addition, in Example 1, a reduction in temperature of about 4% is realized at the second elapsed time as compared with Comparative Example 2.

In Example 2, a reduction in temperature of about 56% is realized at the first elapsed time as compared with Comparative Example 1. In addition, in Example 2, a reduction in temperature of about 45% is realized at the second elapsed time as compared with Comparative Example 1.

In addition, in Example 2, a reduction in temperature of about 34% is realized at the first elapsed time as compared with Comparative Example 2. In addition, in addition, in Example 2, a reduction in temperature of about 20% is realized at the second elapsed time as compared with Comparative Example 2.

In this way, it has been confirmed that a rise in temperature of the electronic apparatus 10 can be suppressed by filling the first heat storage material 18 including a thermally conductive resin and the second heat storage material 19 including a latent heat storage material, serving as the heat storage material 17, in a space in the housing 11 of the electronic apparatus 10. By suppressing a rise in temperature of the electronic apparatus 10, function restriction (thermal shutdown) caused by a rise in temperature can be prevented, usable time such as recording time can be extended, and discomfort to a user can be reduced, for example.

Incidentally, a space in the housing 11 of the electronic apparatus 10 is filled with the heat storage material 17 by filling the heat storage material 17 therein. Therefore, an effect of improvement in impact resistance (robustness) or improvement in drip resistance (waterproofness) can also be achieved.

<2. Second Embodiment>
[2-1. Configuration of Electronic Apparatus]

Figure 7:
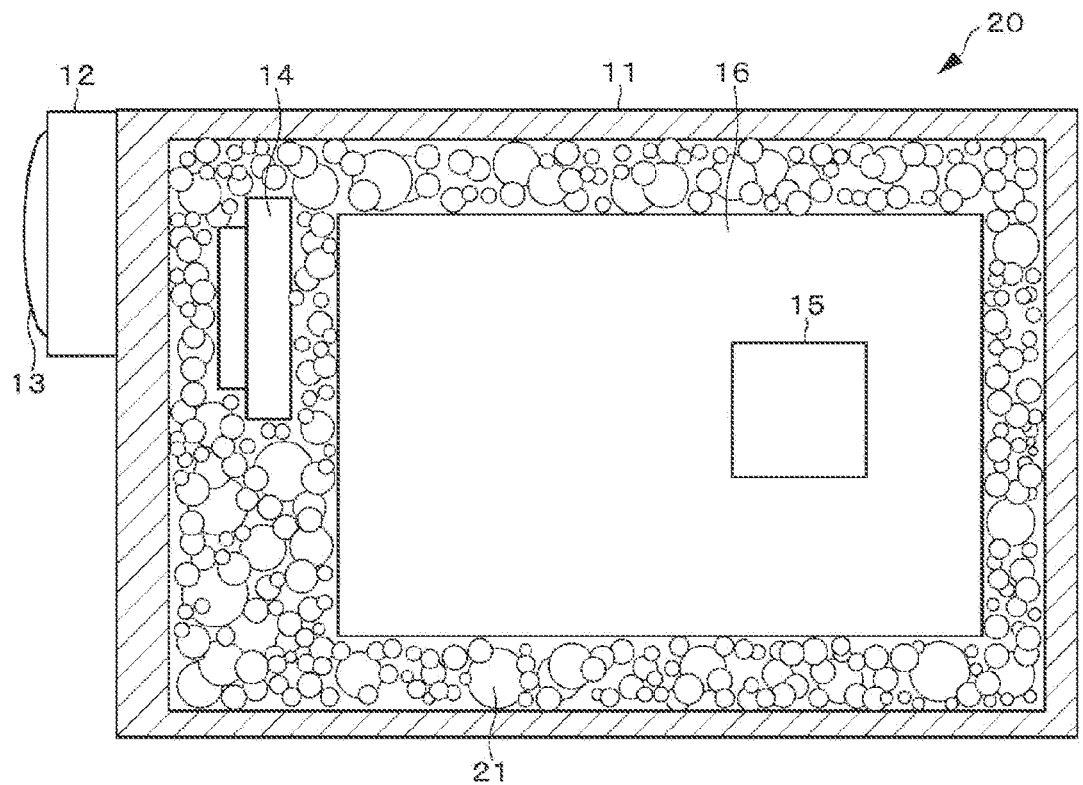
FIG. 7 is a diagram illustrating a configuration of an electronic apparatus according to a second embodiment.

A configuration example of an electronic apparatus 20 according to a second embodiment of the present technology will be described with reference to FIG. 7. Note that the configurations of components other than a heat storage material 21 in the electronic apparatus 20 are similar to those of the first embodiment, and therefore description thereof will be omitted. In the second embodiment, as in the first embodiment, an imaging device will be described as an example of the electronic apparatus 20.

[2-2. Configuration of Heat Storage Material]

Next, details of the heat storage material 21 will be described. A space in a housing 11 is filled with the heat storage material 21. The heat storage material 21 is thermally connected to (physically in contact with) an electronic component such as an imaging element 14, a control circuit 15, or a battery 16 in the electronic apparatus 20, and the whole or some parts of an inner surface of a housing 11, and suppresses a rise in temperature of an inside of the electronic apparatus 20 or a surface of the housing 11 by storing heat generated from the electronic components in a form of latent heat.

The heat storage material 21 includes a latent heat storage material, and is in a form of many fine capsules coated with a polymer, inorganic glass, or the like. The heat storage material 21 stores heat by latent heat. The heat storage material 21 is in a form of capsules, for example, each having a size of several micrometers to several millimeters in diameter. By setting the sizes of the capsules to various sizes without unifying the sizes, it is possible to fill a space in the electronic apparatus 20 with the capsules at a high filling ratio. Note that a method for filling the heat storage material 21 in a space in the electronic apparatus 20 is similar to that in the first embodiment.

Even if the heat storage material 21 includes a capsule-shaped latent heat storage material, the heat storage material 21 absorbs heat released from the imaging element 14, the control circuit 15, the battery 16, and the like, and can efficiently suppress a rise in temperature of an inside of the electronic apparatus 20 or a surface of the housing 11. By preventing a rise in temperature of the electronic apparatus 20, function restriction caused by a rise in temperature can be prevented, usable time such as recording time can be extended, and discomfort to a user can be reduced, for example. In addition, a space in the housing 11 of the electronic apparatus 20 is filled with the heat storage material 21 by filling the heat storage material 21 therein. Therefore, an effect of improvement in impact resistance (robustness) or improvement in drip resistance (waterproofness) can also be achieved.

An organic latent heat storage material, an inorganic hydrated salt-based latent heat storage material, and a solid phase transition heat storage material are similar to those described in the first embodiment.

Note that similarly to the first embodiment, it is necessary to use an insulating material as the heat storage material 21. In addition, similarly to the first embodiment, a non-insulating material can also be used as a heat storage material as long as being not in contact with a metal portion of the control circuit 15 or the like, and in a case where the control circuit 15 or the like is coated with a thin insulating material or covered with a case or the like, a non-insulating heat storage material can be used.

<3. Third Embodiment>
[3-1. Configuration of Electronic Apparatus]

Figure 8:
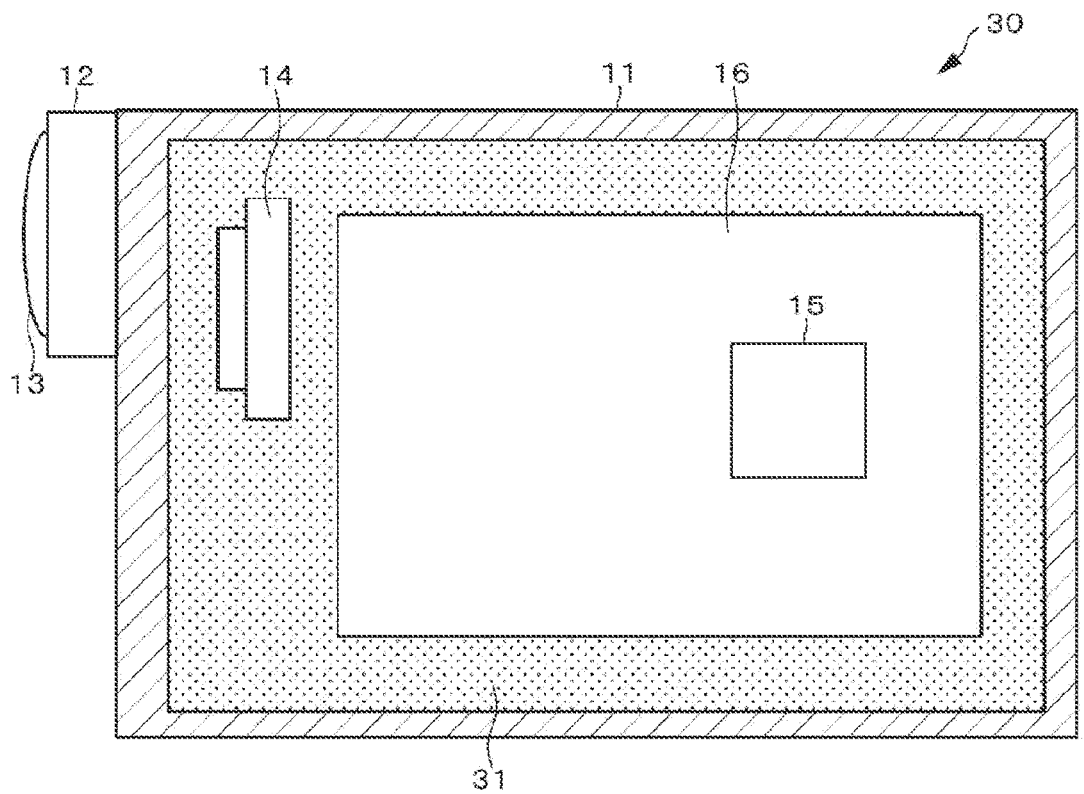
FIG. 8 is a diagram illustrating a configuration of an electronic apparatus according to a third embodiment.

A configuration example of an electronic apparatus 30 according to a third embodiment of the present technology will be described with reference to FIG. 8. Note that the configurations of components other than a heat storage material 31 in the electronic apparatus 30 are similar to those of the first embodiment, and therefore description thereof will be omitted. In the third embodiment, as in the first embodiment, an imaging device will be described as an example of the electronic apparatus 30.

[3-2. Configuration of Heat Storage Material]

Next, details of the heat storage material 31 will be described. A space in a housing 11 is filled with the heat storage material 31. The heat storage material 31 is thermally connected to (physically in contact with) an electronic component such as an imaging element 14, a control circuit 15, or a battery 16 in the electronic apparatus 30, and the whole or some parts of an inner surface of a housing 11, and suppresses a rise in temperature of an inside of the electronic apparatus 30 or a surface of the housing 11 by storing heat generated from the electronic components.

The heat storage material 31 includes a liquid adjusted so as to have an appropriate viscosity or a gel-like thermally conductive resin. The heat storage material 31 stores heat by sensible heat. Note that a method for filling the heat storage material 31 in a space in the electronic apparatus 30 is similar to that in the first embodiment. The heat storage material 31 is a liquid before being injected in the housing 11, and may be cured (solidified) by reacting with moisture or the like in air after injection, or may be hardened (solidified) in the housing 11 after being injected while being mixed by two liquid mixing.

Even if the heat storage material 31 includes a thermally conductive resin, the heat storage material 31 absorbs heat released from the imaging element 14, the control circuit 15, the battery 16, and the like, and can efficiently suppress a rise in temperature of an inside of the electronic apparatus 30 or a surface of the housing 11. By preventing a rise in temperature of the electronic apparatus 30, function restriction caused by a rise in temperature can be prevented, usable time such as recording time can be extended, and discomfort to a user can be reduced, for example. In addition, a space in the housing 11 of the electronic apparatus 30 is filled with the heat storage material 31 by filling the heat storage material 31 therein. Therefore, an effect of improvement in impact resistance (robustness) or improvement in drip resistance (waterproofness) can also be achieved.

Note that the heat storage material 31 may be cured (solidified) after being filled in the housing 11, and may be removable after curing (solidification) (may have reworkability).

The first to third embodiments of the present technology are configured as described above.

<4. Application Example to Other Apparatuses>

Next, an application example of the above-described present technology to another apparatus will be described.

[4-1. First Example]

Figure 9A:
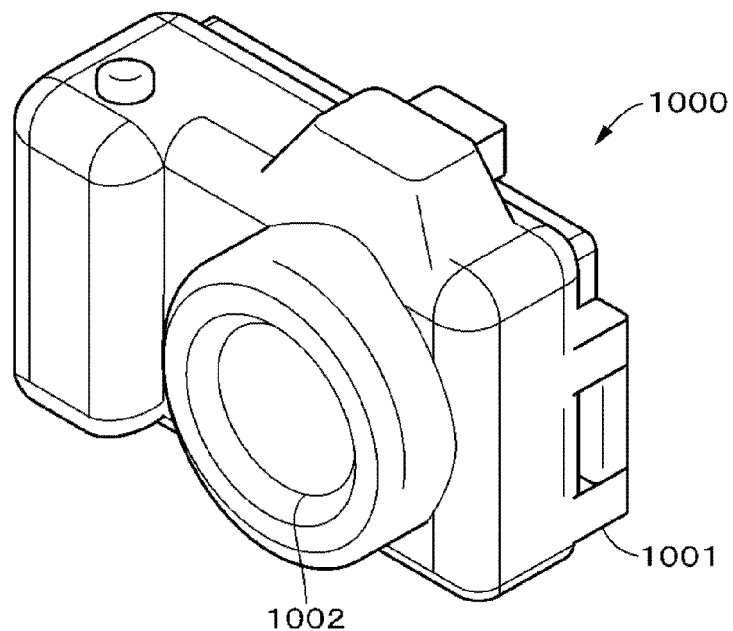
FIG. 9A is an external view of an apparatus in a first application example of the present technology.
Figure 9B:
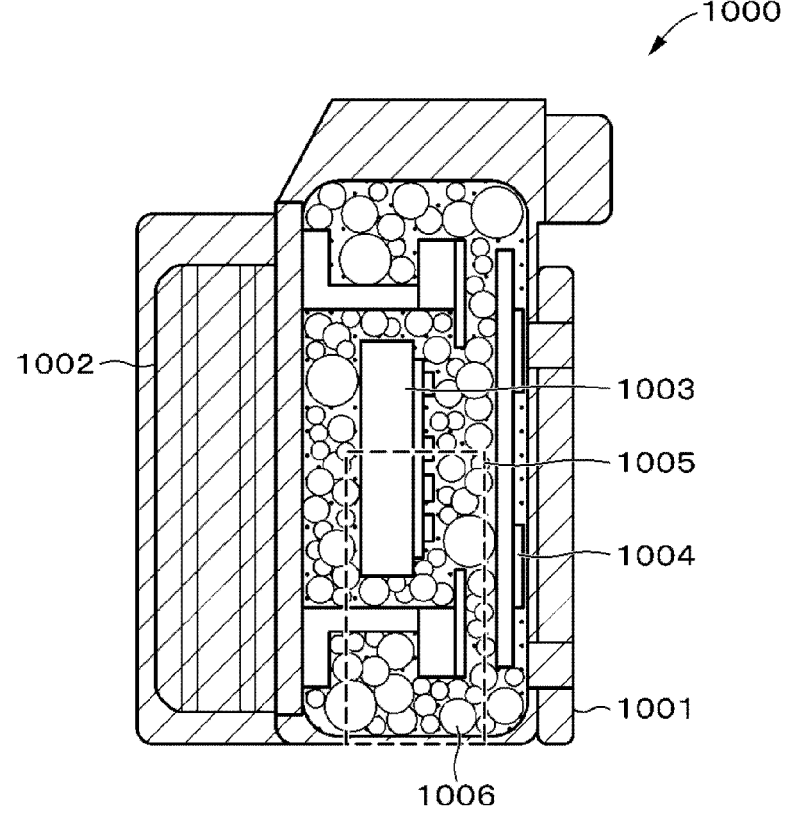
FIG. 9B is a cross-sectional side view of the apparatus.

FIGS. 9A and 9B illustrate a first example of application to another apparatus. The first example is an imaging device called a digital camera, a digital single lens reflex camera, or the like.

An imaging device 1000 includes a housing 1001, an optical imaging system 1002 including a photographing lens or the like, an imaging element 1003, a control circuit 1004, a battery 1005, and a heat storage material 1006.

The housing 1001 includes a synthetic resin such as plastic, metal, or the like, and constitutes an exterior of the imaging device 1000. The optical imaging system 1002, the imaging element 1003, the control circuit 1004, the battery 1005, and the heat storage material 1006 are disposed in the housing 1001.

The configurations of the optical imaging system 1002, the imaging element 1003, the control circuit 1004, the battery 1005, and the heat storage material 1006 are similar to those in the above-described embodiments. The heat storage material 1006 is filled in a gap in the housing 1001, and is thermally connected to (physically in contact with) an electronic component such as the imaging element 1003, the control circuit 1004, or the battery 1005 in the housing 1001. As a result, a space in the imaging device 1000 can be filled without a gap, and a rise in temperature of the imaging element 1003 or an inside and a surface of the imaging device 1000 can be suppressed.

As described above, the configuration in which a heat storage material is filled in a housing of an apparatus according to the present technology can also be applied an imaging device.

[4-2. Second Example]

Figure 10A:
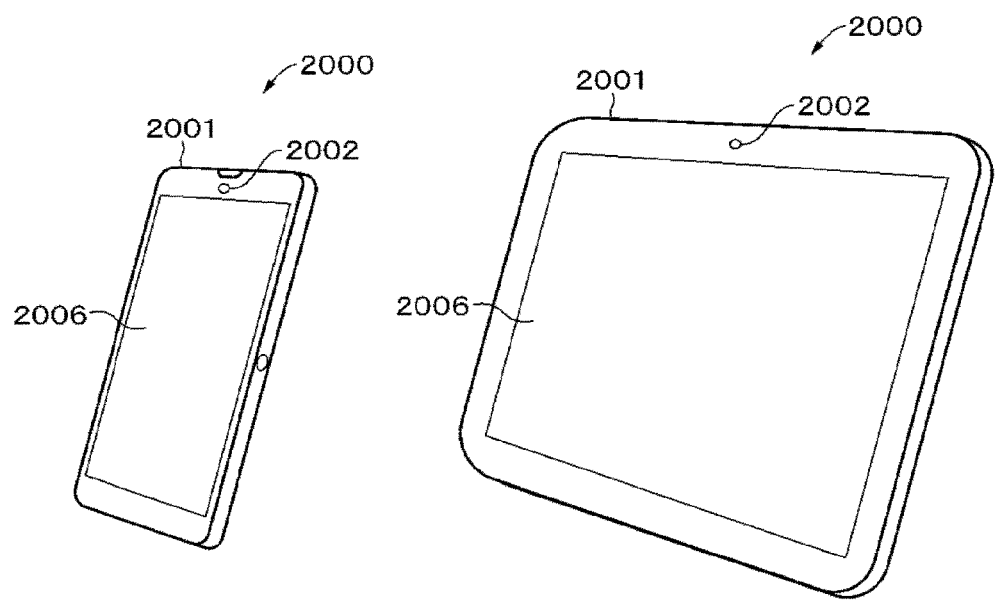
FIG. 10A is an external view of an apparatus in a second application example of the present technology.
Figure 10B:
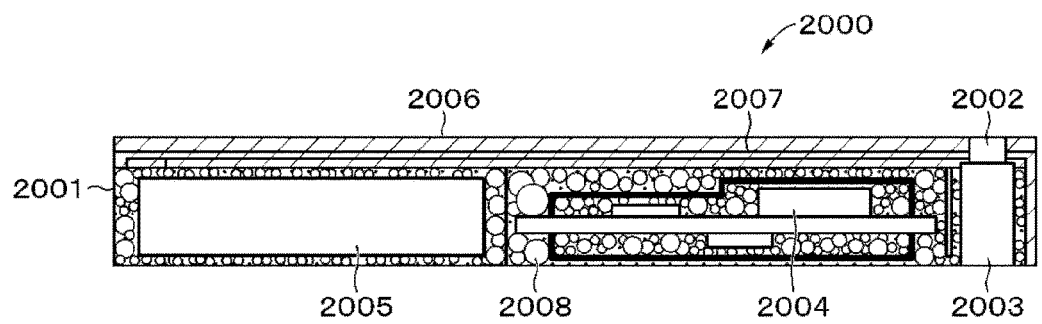
FIG. 10B is a cross-sectional side view of the apparatus.

FIGS. 10A and 10B illustrates a second example of application to an apparatus, and the second example is a portable terminal such as a smartphone or a tablet.

The portable terminal 2000 includes a housing 2001, an optical imaging system 2002 including a photographing lens or the like, an imaging element 2003, a control circuit 2004, a battery 2005, a display 2006, a backlight 2007, and a heat storage material 2008.

The housing 2001 includes a synthetic resin such as plastic, metal, or the like, and constitutes an exterior of the portable terminal 2000. The optical imaging system 2002, the imaging element 2003, the control circuit 2004, the battery 2005, the backlight 2007, and the heat storage material 2008 are disposed in the housing 2001.

The configurations of the optical imaging system 2002, the imaging element 2003, the control circuit 2004, the battery 2005, and the heat storage material 2008 are similar to those in the above-described embodiments.

The display 2006 is a display device including, for example, a liquid crystal display (LCD), a plasma display panel (PDP), an organic electro luminescence (EL) panel and the like. On the display 2006, a user interface of the portable terminal, a menu screen, an application screen, a monitoring image during imaging, a photographed image recorded, a photographed moving image, and the like are displayed.

The backlight 2007 is disposed on a rear side of the display 2006 in the housing 2001, and irradiates the display 2006 with light from behind by emitting light.

The heat storage material 2008 is filled in a gap in the housing 2001, and is thermally connected to (physically in contact with) an electronic component such as the imaging element 2003, the control circuit 2004, or the battery 2005 in the housing 2001. As a result, a space in the portable terminal 2000 can be filled without a gap, and a rise in temperature of the imaging element 2003 or an inside and a surface of the portable terminal 2000 can be suppressed. As described above, the configuration in which a heat storage material is filled in a housing of an apparatus according to the present technology can also be applied a portable terminal such as a smartphone or a tablet.

[4-3. Third Example]

Figure 11A:
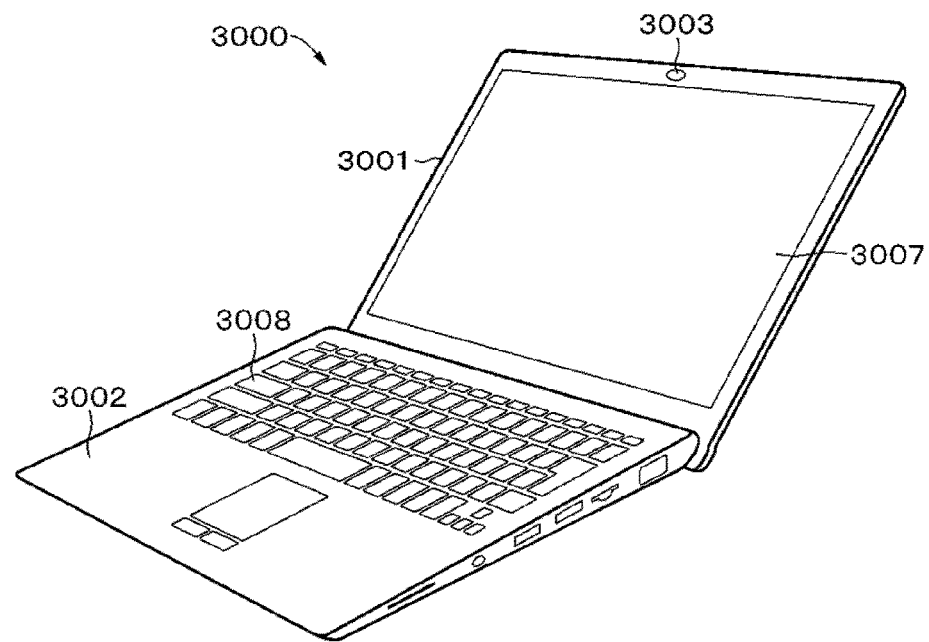
FIG. 11A is an external view of an apparatus in a third application example of the present technology.
Figure 11B:
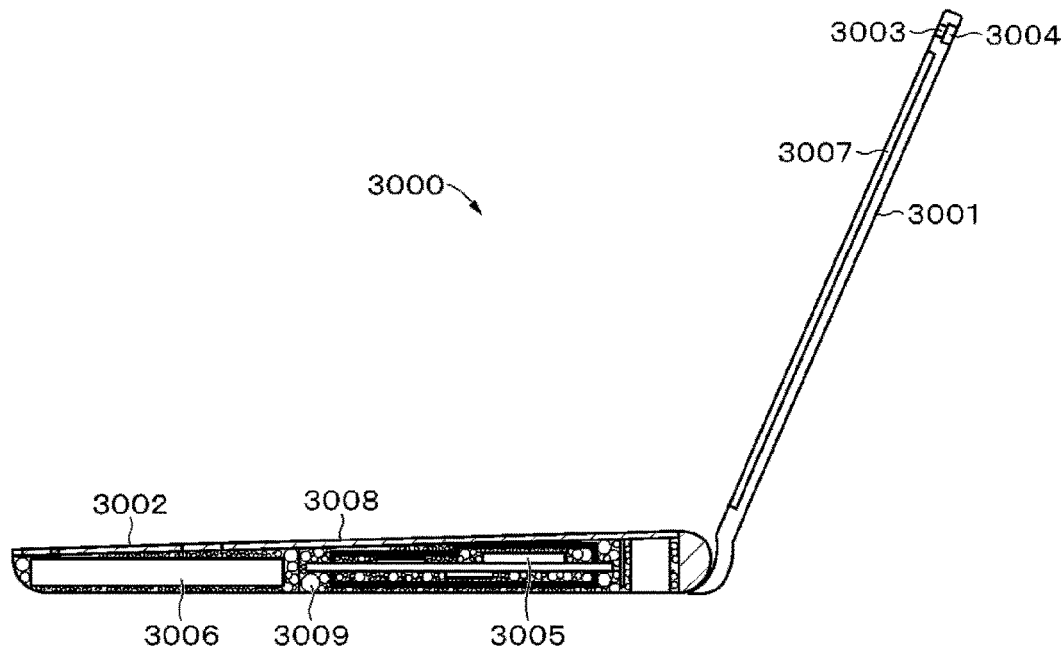
FIG. 11B is a cross-sectional side view of the apparatus.

FIGS. 11A and 11B illustrate a third example of application to an apparatus, and the third example is a portable personal computer (hereinafter, referred to as a notebook personal computer).

A notebook personal computer 3000 includes a display side housing 3001, a keyboard side housing 3002, an optical imaging system 3003 including a photographing lens or the like, an imaging element 3004, a control circuit 3005, a battery 3006, a display 3007, an input unit 3008, and a heat storage material 3009.

Each of the display side housing 3001 and the keyboard side housing 3002 includes a synthetic resin such as plastic, metal, or the like, and constitutes an exterior of the notebook personal computer 3000. The notebook personal computer 3000 is foldable from the display side housing 3001 and the keyboard side housing 3002 connected to the display side housing 3001 via a hinge or the like. The input unit 3008 is disposed in the keyboard side housing 3002.

A configuration for performing a function of a camera, such as the optical imaging system 3003 or the imaging element 3004, is disposed in the display side housing 3001. Meanwhile, the control circuit 3005, the battery 3006, and the heat storage material 3009 are disposed in the keyboard side housing 3002.

The configurations of the optical imaging system 3003, the imaging element 3004, the control circuit 3005, the battery 3006, and the heat storage material 3009 are similar to those in the above-described embodiments.

The configuration of the display 3007 is similar to that described in the above-described portable terminal 2000 as the second example.

The input unit 3008 is a keyboard, a touch pad, or the like for allowing a user to input various instructions to the notebook personal computer 3000.

The heat storage material 3009 is filled in a gap in the keyboard side housing 3002, and is thermally connected to (physically in contact with) an electronic component such as the control circuit 3005 or the battery 3006 in the keyboard side housing 3002. As a result, a space in the keyboard side housing 3002 of the notebook personal computer 3000 can be filled without a gap, and a rise in temperature of an inside and a surface of the keyboard side housing 3002 can be suppressed. As described above, the configuration in which a heat storage material is filled in a housing of an apparatus according to the present technology can also be applied a notebook personal computer.

Figure 12A:
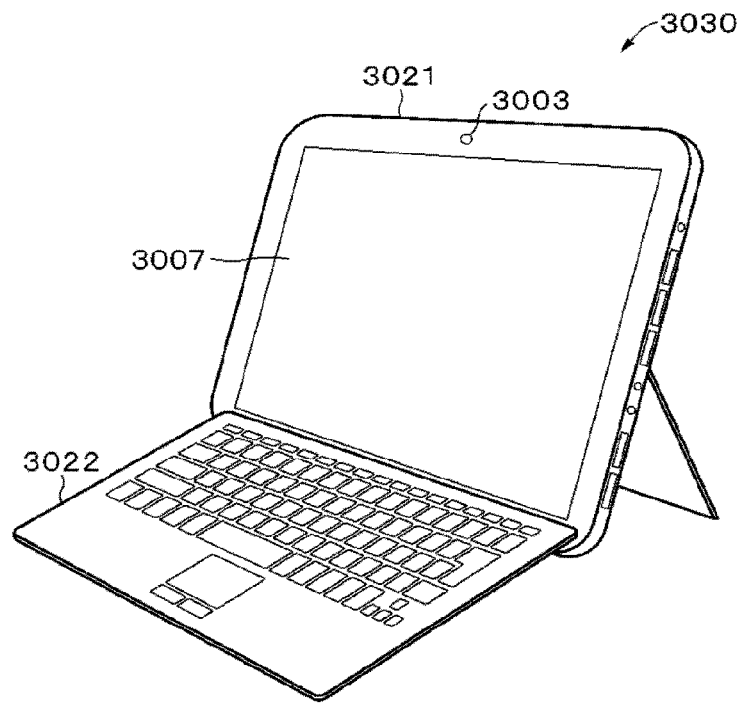
FIG. 12A is an external view of an apparatus in another example of the third application example of the present technology.
Figure 12B:
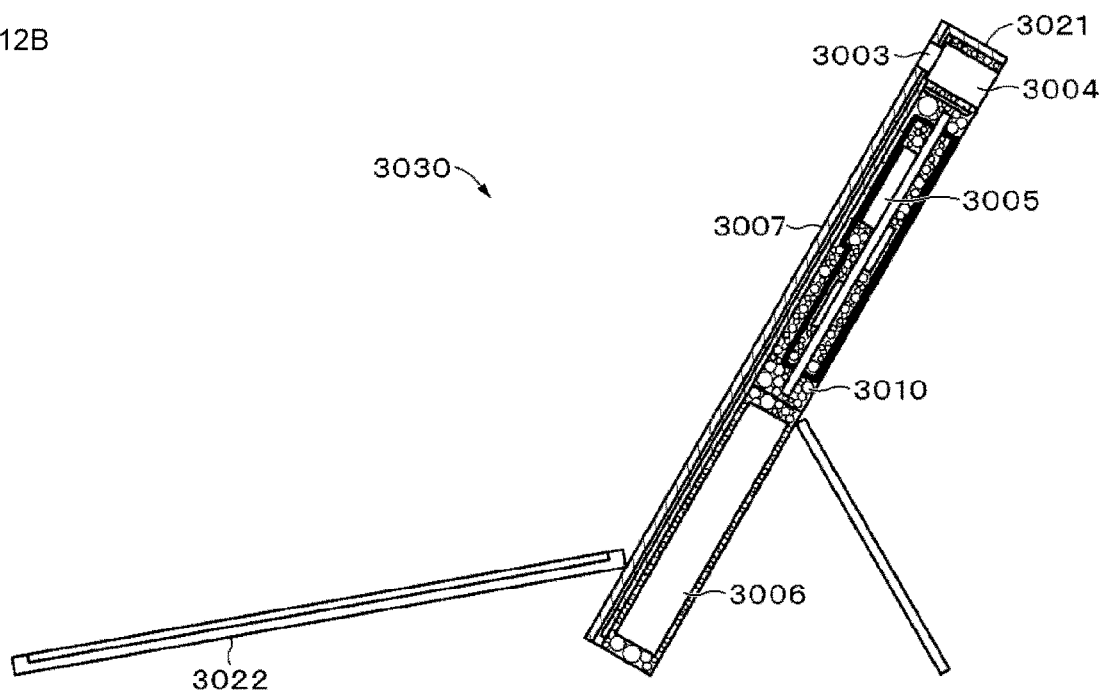
FIG. 12B is a cross-sectional side view of the apparatus.

Incidentally, in recent years, as illustrated in FIGS. 12A and 12B, a notebook personal computer 3030 including a display side housing 3021 and a keyboard side housing 3022, and including a control circuit 3005, a battery 3006, and the like in the display side housing 3021 in addition to an optical imaging system 3003 and an imaging element 3004 has also been commercialized. The present technology can also be applied to such a kind of notebook personal computer. In a case where the control circuit 3005, the battery 3006, and the like are disposed in the display side housing 3021, as illustrated in FIG. 12B, the heat storage material 3010 is filled in the display side housing 3021. As a result, a space in the display side housing 3021 can be filled without a gap, and a rise in temperature of the imaging element 3004 can be suppressed.

[4-4. Fourth Example]

Figure 13A:
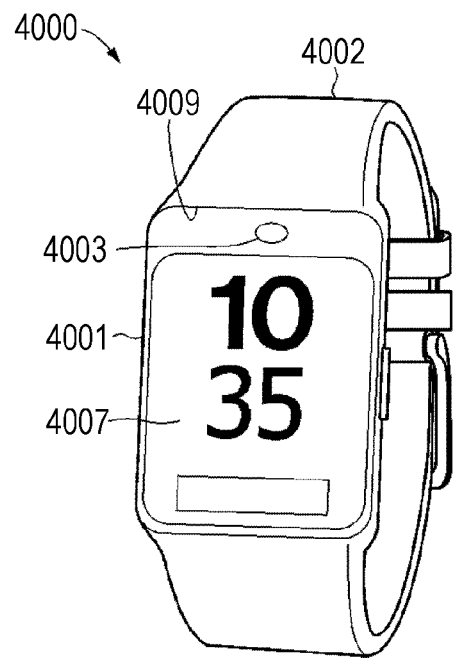
FIG. 13A is an external view of an apparatus in a fourth application example of the present technology.
Figure 13B:
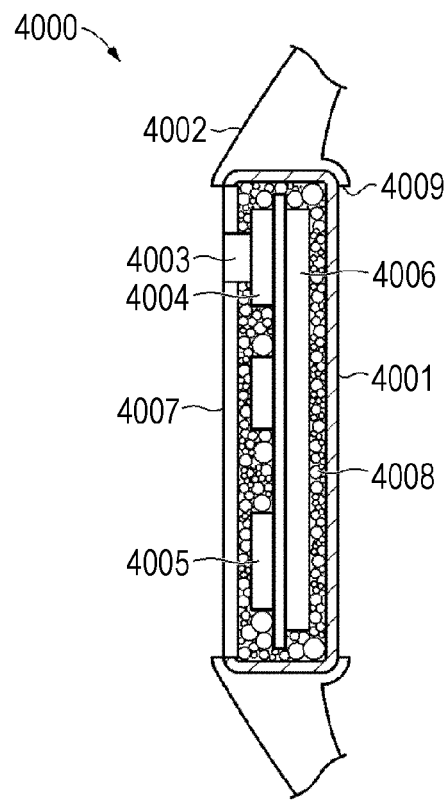
FIG. 13B is a cross-sectional side view of the apparatus.

FIGS. 13A and 13B illustrate a fourth example of application to an apparatus, and the fourth example is a so-called wearable apparatus. The wearable apparatus is an apparatus that a user can wear on his/her body. FIGS. 13A and 13B illustrate a wristwatch type wearable apparatus 4000.

In addition to the wristwatch type, examples of the wearable apparatus include an eyeglass type, a bracelet type, an accessory type, and a cloth type. By using the wearable apparatus, a user can perform photographing, moving image photographing, Internet retrieval, e-mail transmission, and the like without using a portable terminal such as a smartphone. In addition, a user can also measure intake calorie, step count, blood pressure, pulse, blood glucose level, brain wave, and the like with the wearable apparatus.

Such a wearable apparatus necessarily includes a control circuit and a battery. Furthermore, many apparatuses each include an optical imaging system and an imaging element and also have a camera function. Therefore, the present technology can also be applied to such a wearable apparatus.

A wristwatch type wearable apparatus 4000 illustrated in FIGS. 13A and 13B includes a housing 4001, a band 4002, an optical imaging system 4003 including a photographing lens or the like, an imaging element 4004, a control circuit 4005, a battery 4006, a display 4007, and a heat storage material 4008.

The housing 4001 includes a synthetic resin such as plastic, metal, or the like, and constitutes an exterior of the wristwatch type wearable apparatus 4000. The optical imaging system 4003, the imaging element 4004, the control circuit 4005, the battery 4006, the display 4007, and the heat storage material 4008 are disposed in the housing 4001.

The band 4002 includes rubber, plastic, synthetic leather, or the like. The band 4002 is formed in a ring shape, and includes a fitting portion 4009 in which the housing 4001 is fitted. By fitting the housing 4001 in this fitting portion 4009, the housing 4001 and the band 4002 constitute the wristwatch type wearable apparatus 4000. Note that a configuration may be adopted in which the band is connected to one end side and the other end side of the housing 4001 instead of fitting the housing 4001 in the fitting portion 4009 of the band 4002. In addition, the housing 4001 may be integrated with the band in advance.

The configurations of the optical imaging system 4003, the imaging element 4004, the control circuit 4005, the battery 4006, the display 4007, and the heat storage material 4008 are similar to those in the above-described embodiments. The heat storage material 4008 is filled in a gap in the housing 4001, and is thermally connected to (physically in contact with) an electronic component such as the imaging element 4004, the control circuit 4005, or the battery 4006 in the housing 4001. As a result, a space in the wristwatch type wearable apparatus 4000 can be filled without a gap, and a rise in temperature of the imaging element 4004 or an inside and a surface of the wristwatch type wearable apparatus 4000 can be suppressed.

As described above, the configuration in which a heat storage material is filled in a housing of an apparatus according to the present technology can also be applied a wristwatch type wearable apparatus.

[4-5. Fifth Example]

Figure 14A:
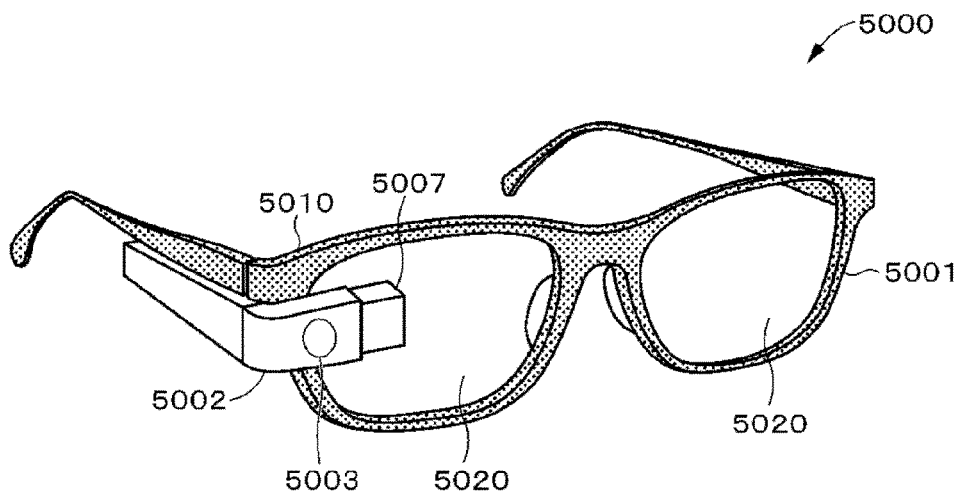
FIG. 14A is an external view of an apparatus in a fifth application example of the present technology.
Figure 14B:
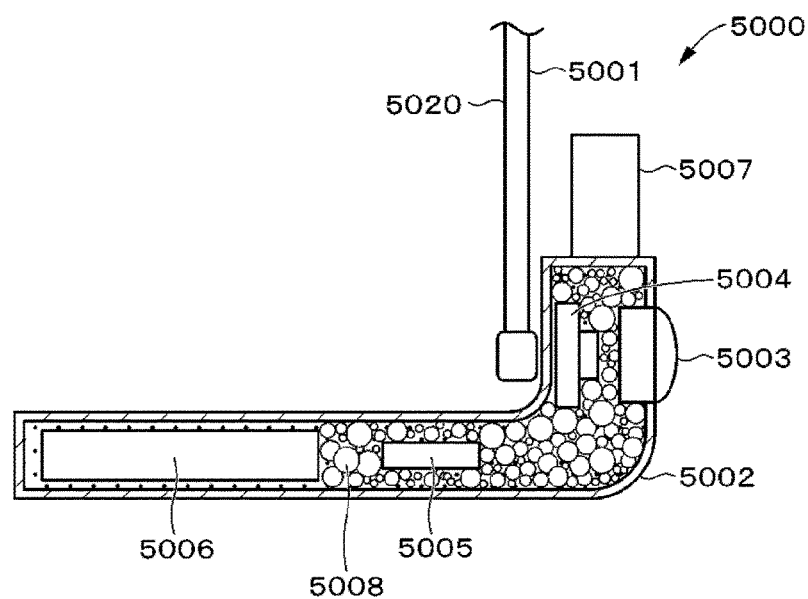
FIG. 14B is a cross-sectional plan view of the apparatus.

FIGS. 14A and 14B illustrate a fifth example of application to an apparatus, and the fifth example is an eyeglass type wearable apparatus.

An eyeglass type wearable apparatus 5000 illustrated in FIGS. 14A and 14B includes glasses 5001, a housing 5002, an optical imaging system 5003 including a photographing lens or the like, an imaging element 5004, a control circuit 5005, a battery 5006, a display 5007, and a heat storage material 5008.

The housing 5002 is formed in a substantially L-shape in plan view with a synthetic resin such as plastic, metal, or the like, and constitutes an exterior of the eyeglass type wearable apparatus 5000. The optical imaging system 5003, the imaging element 5004, the control circuit 5005, the battery 5006, and the heat storage material 5008 are disposed in the housing 5002. In addition, the display 5007 is disposed so as to overlap a lens 5020 of the eyeglasses 5001 from the housing 5002.

The eyeglasses 5001 include a frame 5010 including rubber, plastic, or the like, and a pair of left and right lenses 5020. The housing 5002 is fixed to the frame 5010 of the eyeglasses 5001 to constitute the eyeglass type wearable apparatus 5000. Note that the frame 5010 of the eyeglasses 5001 may be integrated with the housing 5002.

The configurations of the optical imaging system 5003, the imaging element 5004, the control circuit 5005, the battery 5006, and the heat storage material 5008 are similar to those in the above-described embodiments. The display 5007 includes a transmissive display, for example. The heat storage material 5008 is filled in a gap in the housing 5002, and is thermally connected to (physically in contact with) an electronic component such as the imaging element 5004, the control circuit 5005, or the battery 5006 in the housing 5002. As a result, a space in the eyeglass type wearable apparatus 5000 can be filled without a gap, and a rise in temperature of the imaging element 5004 or an inside and a surface of the eyeglass type wearable apparatus 5000 can be suppressed.

As described above, the configuration in which a heat storage material is filled in a housing of an apparatus according to the present technology can also be applied an eyeglass type wearable apparatus.

<5. Modification Example>

Hitherto, embodiments of the present technology have been described specifically. However, the present technology is not limited to the above-described embodiments, but various modifications based on a technical idea of the present technology can be made.

Instead of being thermally connected directly to the imaging element 14 and the control circuit 15, the heat storage material may be thermally connected to a unit having a base on which the imaging element 14 is mounted and a unit having a base on which the control circuit 15 is mounted. In addition, the heat storage material may be thermally connected to a battery case in which the battery 16 is disposed.

In addition, the present technology is effective not only for the imaging element 14, the control circuit 15, and the battery 16 described above in the embodiments, but also for every heat source as long as the heat source generates heat in an electronic apparatus.

In addition, the electronic apparatus according to the present technology can be applied to any apparatus including an imaging element, such as a compact digital video camera used by an enthusiast of outdoor sports or the like for recording his/her activities, a digital camera, a television receiver, a notebook personal computer, a smartphone, a tablet terminal, a portable game machine, a wristwatch type wearable terminal, an eyeglass type wearable terminal, a car navigation system, an interphone system, a robot, or a robot cleaner. By applying the present technology to these electronic apparatuses each including an imaging element, it is possible to prevent a temperature from reaching an upper limit temperature at which each unit such as the imaging element, a control circuit, or a battery cannot be operated. Therefore, usable time such as photographing time can be extended, for example.

Figure 15:
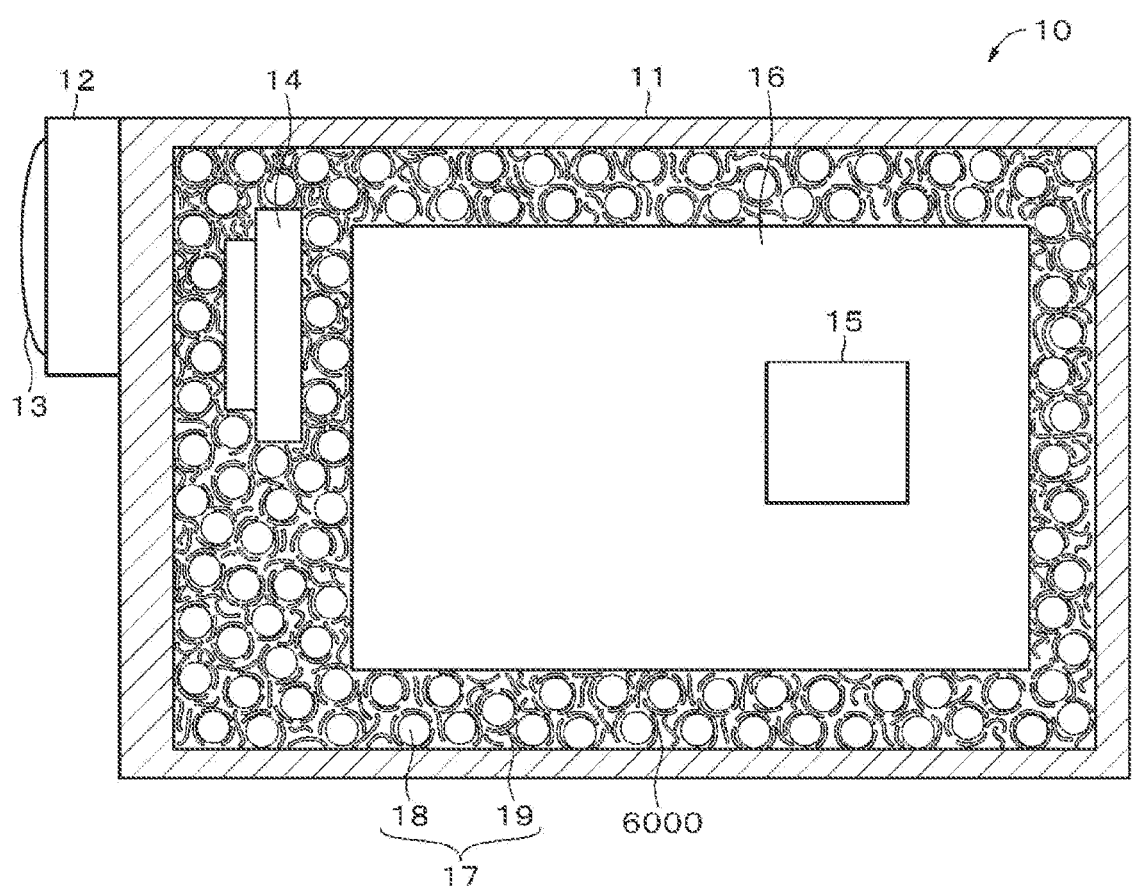
FIG. 15 is a cross-sectional view of an electronic apparatus illustrating a modification example of a heat dissipation filler.

Furthermore, as illustrated in FIG. 15, a heat dissipation filler mixed with a base resin for constituting a thermally conductive resin may be in a form of many fine linear heat dissipation fillers 6000. Specifically, it is considered that a heat dissipation filler formed in a linear shape using boron nitride exerts a high heat dissipation effect.

The present technology can have the following configurations.

(1) An electronic apparatus including:
a housing;
an imaging element disposed in the housing;
a battery disposed in the housing; and
a heat storage material filled in a space in the housing and thermally connected to the imaging element and/or the battery.

(2) The electronic apparatus according to (1), in which the heat storage material includes a thermally conductive resin and a latent heat storage material.

(3) The electronic apparatus according to (2), in which the latent heat storage material is in a form of many particles and mixed with the thermally conductive resin.

(4) The electronic apparatus according to (3), in which the latent heat storage material is in a form of many particles by being coated with an insulating material.

(5) The electronic apparatus according to (1), in which the heat storage material includes a thermally conductive resin and a solid phase transition material.

(6) The electronic apparatus according to (1), in which the heat storage material includes a latent heat storage material.

(7) The electronic apparatus according to (6), in which the latent heat storage material is in a form of many particles.

(8) The electronic apparatus according to any one of (1) to (7), in which
a control circuit is disposed in the housing, and the heat storage material is thermally connected to the control circuit.

(9) The electronic apparatus according to (8), in which the control circuit is coated with an insulating material.

(10) The electronic apparatus according to any one of (1) to (9), in which
a terminal of the battery is coated with an insulating material.

(11) The electronic apparatus according to (1), in which the heat storage material includes a thermally conductive resin.

(12) The electronic apparatus according to any one of (2) to (11), in which
the thermally conductive resin includes a base resin and a filler.

(13) The electronic apparatus according to (12), in which the base resin includes at least one of a silicone resin, a urethane resin, an acrylic resin, and an epoxy resin.

(14) The electronic apparatus according to (13), in which the filler includes at least one of boron nitride (BN), aluminum oxide ($Al_2O_3$), and a carbon fiber.

(15) The electronic apparatus according to (14), in which the carbon fiber is coated with an insulating material.

(16) The electronic apparatus according to any one of (2) to (15), in which
the latent heat storage material includes vanadium dioxide ($VO_2$).

(17) The electronic apparatus according to (16), in which the vanadium dioxide ($VO_2$) is coated with an insulating material to form many particles.

(18) The electronic apparatus according to (14), in which a control circuit coated with an insulating material and thermally connected to the heat storage material is disposed in the housing, and
the filler includes the carbon fiber which has not been subjected to insulation coating.

(19) The electronic apparatus according to (16), in which a control circuit coated with an insulating material and thermally connected to the heat storage material is disposed in the housing, and
the latent heat storage material includes the vanadium dioxide ($VO_2$) which has not been subjected to insulation coating.

(19) The electronic apparatus according to (12), in which the filler includes a plurality of linear members.

REFERENCE SIGNS LIST

10, 20, 30 Electronic apparatus
11 Housing
14 Imaging element
15 Control circuit
16 Battery
17, 21, 31 Heat storage material
18 First heat storage material
19 Second heat storage material

The invention claimed is:
1. An electronic apparatus, comprising:
a housing;
an imaging element inside the housing;
a battery inside the housing; and
a heat storage material inside the housing, wherein the heat storage material is thermally connected to each of the imaging element and the battery.

2. The electronic apparatus according to claim 1, wherein the heat storage material includes a thermally conductive resin and a latent heat storage material.

3. The electronic apparatus according to claim 2, wherein the thermally conductive resin includes a base resin and a filler.

4. The electronic apparatus according to claim 3, wherein the base resin includes at least one of a silicone resin, a urethane resin, an acrylic resin, and an epoxy resin.

5. The electronic apparatus according to claim 3, wherein the filler includes at least one of boron nitride (BN), aluminum oxide ($Al_2O_3$), and a carbon fiber.

6. The electronic apparatus according to claim 5, wherein the carbon fiber is coated with an insulating material.

7. The electronic apparatus according to claim 5, further comprises a control circuit inside the housing, wherein
the control circuit is coated with an insulating material,
the control circuit is thermally connected to the heat storage material, and
the filler includes the carbon fiber.

8. The electronic apparatus according to claim 3, wherein the filler includes a plurality of linear heat dissipation members.

9. The electronic apparatus according to claim 2, wherein the latent heat storage material includes vanadium dioxide ($VO_2$).

10. The electronic apparatus according to claim 9, wherein the vanadium dioxide ($VO_2$) is coated with an insulating material.

11. The electronic apparatus according to claim 9, further comprises a control circuit inside the housing, wherein
the control circuit is coated with an insulating material, and
the control circuit is thermally connected to the heat storage material.

12. The electronic apparatus according to claim 2, wherein
the latent heat storage material includes a plurality of particles, and
the heat storage material is a mixture of the thermally conductive resin and the plurality of particles.

13. The electronic apparatus according to claim 12, wherein
the plurality of particles is coated with an insulating material.

14. The electronic apparatus according to claim 1, wherein the heat storage material includes a thermally conductive resin and a solid phase transition material.

15. The electronic apparatus according to claim 1, wherein the heat storage material includes a latent heat storage material.

16. The electronic apparatus according to claim 15, wherein the latent heat storage material includes a plurality of particles.

17. The electronic apparatus according to claim 1, further comprises a control circuit inside the housing, wherein the heat storage material is thermally connected to the control circuit.

18. The electronic apparatus according to claim 17, wherein the control circuit is coated with an insulating material.

19. The electronic apparatus according to claim 1, wherein a terminal of the battery is coated with an insulating material.

20. The electronic apparatus according to claim 1, wherein the heat storage material includes a thermally conductive resin.

21. The electronic apparatus according to claim 1, wherein the heat storage material is in physical contact with each of the imaging element and the battery.

* * * * *